United States Patent
Sawada et al.

(10) Patent No.: US 11,810,619 B2
(45) Date of Patent: Nov. 7, 2023

(54) SEMICONDUCTOR DEVICE HAVING A CONTENTS ADDRESSABLE MEMORY

(71) Applicant: RENESAS ELECTRONICS CORPORATION, Tokyo (JP)

(72) Inventors: Yohei Sawada, Tokyo (JP); Masao Morimoto, Tokyo (JP); Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 106 days.

(21) Appl. No.: 17/382,322

(22) Filed: Jul. 21, 2021

(65) Prior Publication Data

US 2022/0028455 A1     Jan. 27, 2022

(30) Foreign Application Priority Data

Jul. 27, 2020    (JP) ................................ 2020-126080

(51) Int. Cl.
     *G11C 15/04*      (2006.01)
(52) U.S. Cl.
     CPC .................... *G11C 15/04* (2013.01)
(58) Field of Classification Search
     CPC ........ G11C 15/04; G11C 15/046; G11C 15/00
     USPC ................... 365/49.1, 49.17, 49.11
     See application file for complete search history.

(56) References Cited

U.S. PATENT DOCUMENTS

| | | | |
|---|---|---|---|
| 5,325,325 A | 6/1994 | Azuma | |
| 7,203,081 B2 | 4/2007 | Nishiyama et al. | |
| 10,629,264 B2 | 4/2020 | Sawada et al. | |
| 2019/0043582 A1* | 2/2019 | Yabuuchi | ............... H10B 99/00 |
| 2019/0198107 A1* | 6/2019 | Yabuuchi | ............... G11C 5/145 |

FOREIGN PATENT DOCUMENTS

| | | |
|---|---|---|
| JP | 03-154289 A | 7/1991 |
| JP | H03-286494 A | 12/1991 |
| JP | 2005-228461 A | 8/2005 |
| JP | 2018-206451 A | 12/2018 |

OTHER PUBLICATIONS

Japanese Notice of Reasons for Refusal issued in corresponding Japanese Patent Application No. 2020-126080, dated Aug. 22, 2023, with English translation.

* cited by examiner

*Primary Examiner* — Alfredo Bermudez Lozada
(74) *Attorney, Agent, or Firm* — McDermott Will & Emery LLP

(57) ABSTRACT

The plurality of CAM cells MC are configured to discriminate a match or mismatch between stored data stored in advance and search data. A match line is coupled to a plurality of CAM cells, and has a voltage level controlled based on discrimination results of the plurality of CAM cells. A first transistor and a second transistor are coupled in series between a common match output line and a predetermined power source. The first transistor is controlled to be turned ON or OFF based on a voltage level of the match line, and the second transistor is controlled to be turned ON or OFF by a search enabling signal asserted at the time of a search operation.

12 Claims, 15 Drawing Sheets

SEMICONDUCTOR DEVICE HAVING A CONTENTS ADDRESSABLE MEMORY

CROSS-REFERENCE TO RELATED APPLICATIONS

The disclosure of Japanese Patent Application No. 2020-126080 filed on Jul. 27, 2020, including the specification, drawings and abstract is incorporated herein by reference in its entirety.

BACKGROUND

The present invention relates to a semiconductor device, and more particularly relates to a semiconductor device including, for example, a CAM (Content Addressable Memory).
There are disclosed techniques listed below.
[Patent Document 1] Japanese Unexamined Patent Application Publication No. 2011-181147

SUMMARY

Patent Document 1 discloses a content addressable memory device that achieves both low power consumption and high speed. Specifically, a match amplifier A determines a match or mismatch between data stored in the content addressable memory in an entry of a memory array A and search data, in response to a voltage of a match line MLA. A match amplifier B also operates in the same manner for a memory array B. A block-B control circuit 210 starts search in the memory array A, and starts a search in the memory array A after two cycles. A block-B activation control circuit 207 stops the search operation in the memory array B in response to the voltage of the match line MLA after the search in the memory array A.

For example, the technique disclosed in Patent Document 1 allows the block-B activation control circuit to observe whether or not there is a match to any one of the match lines, and to abort a search operation in a subsequent TCAM (Ternary CAM) macro including the memory array B if there is a mismatch for all of the lines. This block-B activation control circuit is arranged in a wrapper outside of the TCAM macro, and is a circuit that performs OR operations on all of the match lines using a plurality of logic gates. However, using logic gates in such a wrapper may result in a large signal delay.

Other objects and novel characteristics will be apparent from the description of the present specification and accompanying drawings.

A semiconductor device according to an embodiment of the present invention has a CAM unit. The CAM unit comprises a plurality of CAM entries, a plurality of search lines provided so as to be common to the plurality of CAM entries and to which search data from outside the semiconductor device are input, and a common match output line provided so as to be common to the plurality of CAM entries. Each of the plurality of CAM entries has a plurality of CAM cells, a match line, a first transistor, and a second transistor. The plurality of CAM cells discriminate a match or mismatch between stored data stored in advance and the search data. The match line is coupled to the plurality of CAM cells, and has a voltage level controlled based on discrimination results of the plurality of CAM cells. The first transistor and the second transistor are coupled in series between the common match output line and a predetermined power source. Here, the first transistor is controlled to be turned ON or OFF based on the voltage level of the match line, and the second transistor is controlled to be turned ON or OFF by a search enabling signal asserted at the time of the search operation.

Using the semiconductor device according to the embodiment of the present invention allows signal delay in the semiconductor device including the CAM to be reduced.

BRIEF DESCRIPTIONS OF THE DRAWINGS

DETAILED DESCRIPTION

In the embodiment described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification, detailed or supplementary description or the like. In addition, in the embodiment described below, when referring to the number of a component (including number of pieces, numerical value, amount and range), the number is not limited to a specified number and may be less than or greater than this number unless otherwise clearly specified or unless it is obvious from the context that the number is limited to the specified number in principle.

Furthermore, in the embodiment described below, it goes without saying that each component (including an element step) is not indispensable unless otherwise clearly specified or unless it is obvious from the context that the component is indispensable in principle. Likewise, in the embodiment described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

In addition, circuit elements that configure each functional block in the embodiment are formed on a semiconductor substrate, such as a single-crystal silicon, using known integrated circuit techniques such as CMOS (complementary MOS transistor). However, the invention is not to be limited to such a configuration. Note that in the following embodiments, an n-channel MOS (Metal Oxide Semiconductor) transistor is referred to as an nMOS transistor, and a p-channel MOS transistor is referred to as a pMOS transistor.

Hereinafter, embodiments of the present invention will be described with reference to the drawings. Note that, in all of the drawings, the same members are denoted by the same reference signs, and redundant descriptions thereof are omitted as appropriate.

First Embodiment

Overview of Semiconductor Device

Figure 1:
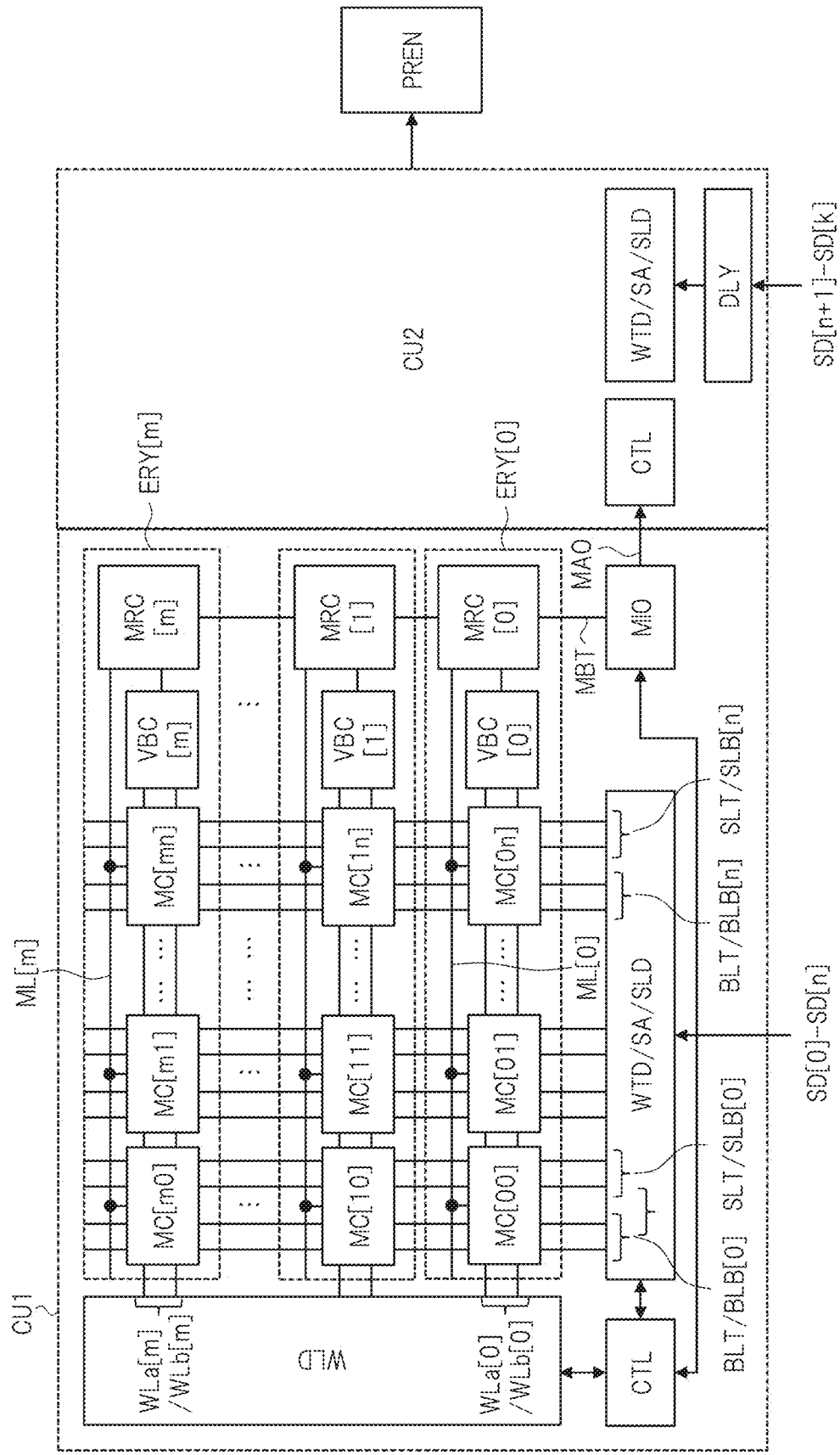
FIG. 1 is a schematic view showing a configuration example of a main portion in a semiconductor device according to a first embodiment of the present invention.

FIG. 1 is a schematic view showing a configuration example of a main portion in a semiconductor device according to a first embodiment of the present invention. The semiconductor device shown in FIG. 1 comprises a plurality (two in this example) of CAM units (CAM macros) CU1 and CU2, and a priority encoder PREN. The CAM unit CU1 comprises a plurality (m+1) of CAM entries ERY[0]-ERY[m], a word line driver WLD, a write driver WTD, a sense amplifier SA, a search line driver SLD, a control circuit CTL, and a match signal output circuit MIO.

In addition, the CAM unit CU1 comprises a plurality (m+1) of word lines WLa[0]-WLa[m], and a plurality (m+1) of word lines WLb[0]-WLb[m]. In the present specification, the word lines WLa[0]-WLa[m] and WLb[0]-WLb[m] are collectively referred to as a word line WL. In addition, the word lines WLa[0]-WLa[m] are collectively referred to as an A-series word line WLa, and the word lines WLb[0]-WLb[m] are collectively referred to as a B-series word line WLb. The word lines Wl are arranged side by side in a row direction.

Further, the CAM unit CU1 comprises a plurality (n+1) of bit lines BLT[0]-BLT[n] and inverted bit lines BLB[0]-BLB[n], and a plurality (n+1) of search lines SLT[0]-SLT[n] and inverted search lines SLB[0]-SLB[n]. The bit line BLT[i] (i=0, 1, ..., m) and the inverted bit line BLB[i] configure a bit line pair. The search line SLT[i] (i=0, 1, ..., n) and the inverted search line SLB[i] configure a search line pair.

In the present specification, the bit lines BLT[0]-BLT[n] are collectively referred to as a bit line BLT, the inverted bit lines BLB[0]-BLB[n] are collectively referred to as an inverted bit line BLB. In addition, the search lines SLT[0]-SLT[n] are collectively referred to as a search line SLT, and the inverted search lines SLB[0]-SLB[n] are collectively referred to as an inverted search line SLB. The bit line BLT, the inverted bit line BLB, the search line SLT and the inverted search line SLB are arranged side by side in a column direction intersecting the row direction.

The word lines WLa[j] and WLb[j] (j=0, 1, ..., m) are coupled to the CAM entry ERY[j]. The CAM entry ERY[0] comprises a plurality (n+1) of CAM cells MC[00]-MC[On], a valid bit cell VBC[0], a match read cell MRC[0], and a match line ML[0]. Each of the CAM cells MC[0$i$] (i=0, 1, ..., n) is arranged at an intersection between the word lines WLa[0], WLb[0] and the bit line BLT[i] (inverted bit line BLB[i]) or the search line SLT[i] (inverted search line SLB[1]). The match line ML[0] extends toward the column direction, and is coupled to the plurality of CAM cells MC[00]-MC[0$n$].

Likewise, the CAM entry ERY[m] comprises a plurality (n+1) of CAM cells MC[m0]-MC[mn], a valid bit cell VBC[m], a match read cell MRC[m], and a match line ML[m]. Each of the CAM cells MC[mi] (i=0, 1, ..., n) is arranged at an intersection between the word lines WLa[m], WLb[m] and the bit line BLT[i] (inverted bit line BLB[i]) or the search line SLT[i] (inverted search line SLB[i]) The match line ML[m] extends toward the column direction, and is coupled to the plurality of CAM cells MC[m0]-MC[mn].

In the present specification, the CAM entries ERY[0]-ERY[m] are collectively referred to as a CAM entry ERY, and the CAM cells MC[00]-MC[mn] are collectively referred to as a CAM cell MC. In addition, the match lines ML[0]-ML[m] are collectively referred to as a match line ML. Further, the valid bit cells VBC[0]-VBC[m] are collectively referred to as a valid bit cell VBC, and the match read cells MRC[0]-MRC[m] are collectively referred to as a match read cell MRC.

As shown in FIG. the bit line BLT (inverted bit line BLB) and the search line SLT (inverted search line SLB) are provided so as to be common to the plurality of CAM entries ERY[0]-ERY[m]. Search data SD[0]-SD[n] from outside the semiconductor device are input to the search lines SLT[0]-SLT[n] (inverted search lines SLB[0]-SLB[n]). In the present specification, the search data SD[0]-SD[n] are collectively referred to as search data SD. As will be described below in more detail, each of the plurality of CAM entries ERY[0]-ERY[m] determines a match or mismatch between stored data stored in the CAM cell MC and the search data SD, and outputs the determination result to the match line ML.

For example, if there is a match for all of the bits between the search data SD[0]-SD[n] and the stored data of the CAM cells MC[00]-MC[0$n$] of the CAM entry ERY[0], the match line ML[0] is set to a voltage level indicating a match (such as level "1"). On the other hand, if there is a mismatch for one or more bits between the search data SD and the stored data, the match line ML[0] is set to a voltage level indicating a mismatch (such as level "0"). Likewise, for example, if there is a match between the search data SD and the stored data of the CAM entry ERY[m], the match line ML[m] is set to a voltage level indicating a match (level "1").

The valid bit cell VBC[j] (j=0, 1, ..., m) stores valid data of the CAM entry ERY[j]. Valid data are data defining validity or invalidity of the corresponding CAM entry ERY. For example, if the valid data of the valid bit cell VBC[0] of the CAM entry ERY[0] are data indicating "invalid", the match line ML[0] is fixed to a voltage level indicating a mismatch.

In addition, as shown in FIG. 1, a common match output line MBT extending in the row direction is provided so as to be common to the plurality of CAM entries ERY[0]-ERY[m]. The match read cells MRC[0]-MRC[m] are coupled to this common match output line MBT. As will be described below in more detail, if, for example, there is a mismatch between the search data SD and all of the CAM entries ERY[0]-ERY[m], the common match output line MBT is controlled to be at a predetermined voltage level.

The match signal output circuit MIO is provided so as to be common to the plurality of CAM entries ERY[0]-ERY[m]. The match signal output circuit MIO outputs a match all-out signal MAO based on the voltage level of the common match output line MBT. The word line driver WLD drives the plurality of word lines WL. At the time of a write operation, the write driver WTD writes predetermined stored data to the plurality of CAM cells MC in the CAM entry ERY selected by the word line WL via the bit line BLT and the inverted bit line BLB.

At the time of a read operation, the sense amplifier SA amplifies a readout signal of the stored data that are read out from the plurality of CAM cells MC in the CAM entry ERY selected by the word line WL to the bit line BLT (and the inverted bit line BLB). At the time of a search operation, the search line driver SLD drives the search line SLT (inverted search line SLB) based on the search data from outside the semiconductor device. The control circuit CTL controls the word line driver WLD, the write driver WTD, the sense amplifier SA, the search line driver SLD, and the match signal output circuit MIO as necessary in response to the write operation, the read operation, and the search operation.

The CAM unit CU2 comprises a substantially similar configuration as the CAM unit CU1, and performs operations in a similar manner as the CAM unit all by receiving the search data SD[n+1]-SD[k] from outside the semiconductor device. In other words, in the example shown in FIG. 1, the search data SD[0]-SD[k] are divided into two parts, and some of the bit regions (SD[0]-SD[n]) are input to the CAM unit CU while the remaining bit regions (SD[n+1]-SD[k]) are input to the CAM unit CU2.

At the time of the search operation, if there is a matching CAM entry ERY in the CAM unit CU1, the CAM unit CU2 performs the search operation for the remaining bit regions. On the other hand, if there is no matching CAM entry ERY in the CAM unit CU1, the CAM unit CU2 does not perform the search operation. The match signal output circuit MIO in the CAM unit CU1 discriminates whether or not there is a matching CAM entry ERY based on the common match output line MBT, and outputs the discrimination results using the match all-out signal MAO.

The control circuit CTL in the CAM unit CU2 controls activation or deactivation of the search operation in the CAM unit CU2 based on the match all-out signal MAO from the CAM unit CU1. In addition, unlike the CAM unit CU1, the CAM unit CU2 comprises a delay circuit DLY. The delay circuit DLY delays the input search data SD[n+1]-SD[k], and outputs the data to the search line driver SLD. Delay time of this delay circuit DLY is defined based on the time required for the search operation of the CAM unit CU1 (i.e., the time required to obtain the match all-out signal MAO).

At the time of the search operation, if there is a match to the plurality of match lines ML, the priority encoder PREN selects one of the match lines ML based on a predetermined priority level. Then, the priority encoder PREN outputs an address signal corresponding to the selected match line ML. Although not shown in the drawings, the semiconductor device may comprise an SRAM (Static Random Access Memory) that receives the output address signal and performs a readout operation, a CPU (Central Processing Unit) that performs various types of processing (such as network routing processing), and the like.

Details of CAM Cell

Figure 2:
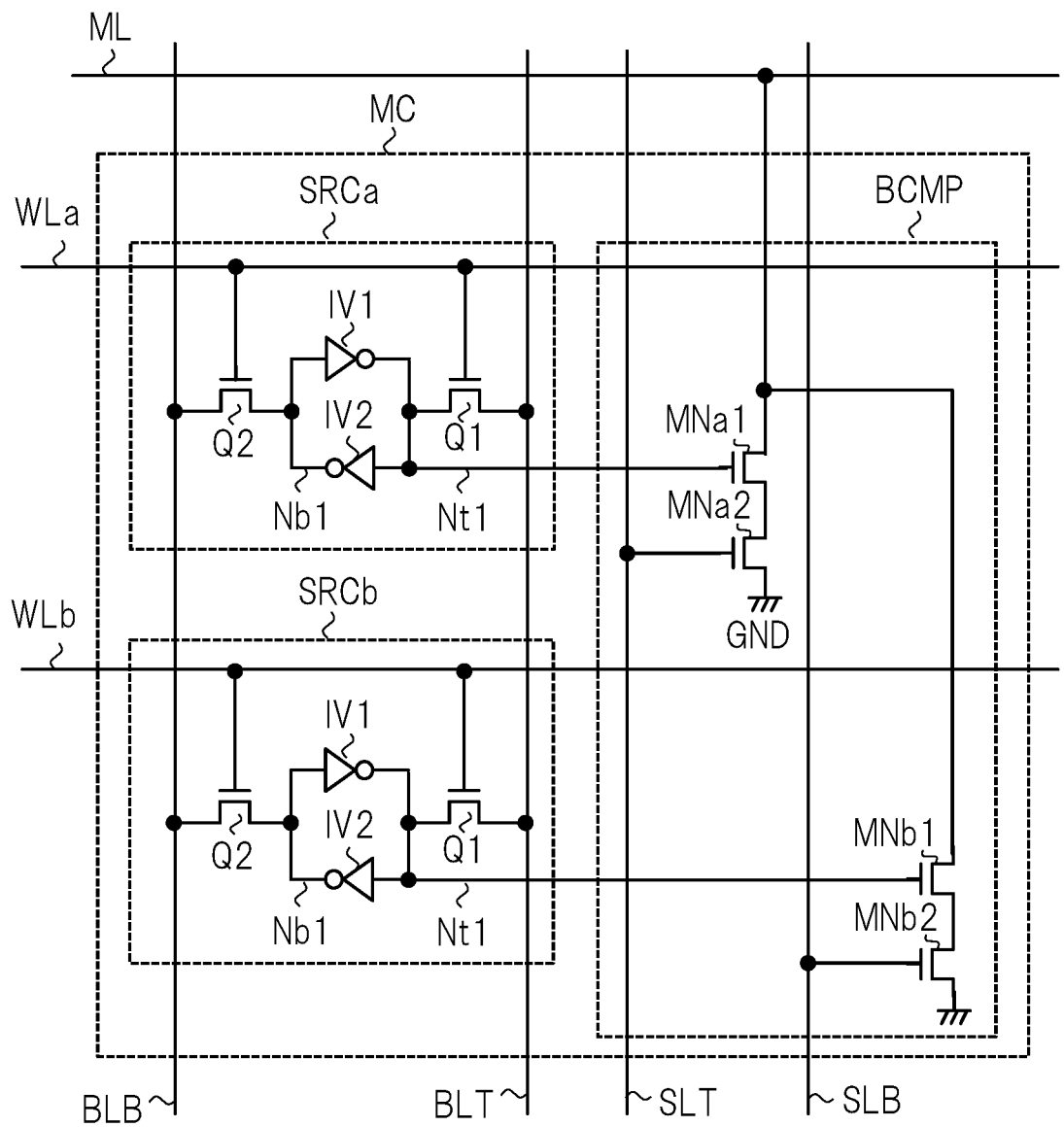
FIG. 2 is a circuit diagram showing a configuration example of each of the CAM cells shown in FIG. 1.

FIG. 2 is a circuit diagram showing a configuration example of each of the CAM cells shown in FIG. 1. The CAM cell MC shown in FIG. 2 stores the stored data of three values ("1", "0", "x" (don't-care)) in two bits, and discriminates a match or mismatch between the stored data and the search data. Such a CAM cell that handles these three values is called a TCAM cell. The CAM cell MC comprises two SRAM cells SRCa and SRCb, and a bit comparison circuit BCMP. Each of the SRAM cells SRCa and SRCb comprises two inverters IV1 and IV2, and two access transistors (such as nMOS transistors) Q1 and Q2.

The two inverters IV1 and IV2 have an output of one coupled to an input of the other to configure a latch circuit. The access transistor Q1 couples a storage node Nt1 of the latch circuit to the bit line BLT. The access transistor Q2 couples an inverted storage node Nb1 of the latch circuit to the inverted bit line BLB. The access transistors Q1 and Q2 of the SRAM cell SRCa are controlled to be turned ON or OFF by the word line WLa, and the access transistors Q1 and Q2 of the SRAM cell SRCb are controlled to be turned ON or OFF by the word line WLb.

The bit comparison circuit BCMP comprises two MOS transistors (nMOS transistors) MNa1 and MNa2, and two MOS transistors (nMOS transistors) MNb1 and MNb2. The two MOS transistors MNa1 and MNa2 are coupled in series between the match line ML and a low potential-side power source GND. Likewise, the two MOS transistors MNb1 and MNb2 are also coupled in series between the match line ML and the low potential-side power source GND.

The MOS transistor MNa1 is controlled to be turned ON or OFF by the storage node Nt1 in the SRAM cell SRCa. The MOS transistor MNa2 is controlled to be turned ON or OFF by the search line SLT. On the other hand, the MOS transistor MNb1 is controlled to be turned ON or OF by the storage node Nt1 in the SRAM cell SRCb. The MOS transistor MNb2 is controlled to be turned ON or OFF by the inverted search line SLB.

Here, if there is a match between the stored data of the CAM cell MC and the search data SC of the search line SLT, the match line ML is set at a high impedance and, as a result, is controlled to maintain a precharge level (level "1") of the match line ML. On the other hand, if there is a mismatch between the stored data of the CAM cell MC and the search data SD of the search line SLT the match line ML is controlled to change to level "0" (voltage level of the low potential-side power source GND).

Accordingly, if the stored data of the CAM cell MC are set to data "1", data "0" is written in the storage node Nt1 of the SRAM cell SRCa, and data "1" is written in the storage node Nt1 of the SRAM cell SRCb. In this state, if the search data of the search line SLT are set to data "1" (i.e., if there is a match), the MOS transistor MNa1 and the MOS transistor MNb2 are turned OFF. Therefore, the match line ML maintains level "1". On the other hand, if the search data of the search line SLT are set to data "0" (i.e., if there is a mismatch), the MOS transistors MNb1 and MNb2 are both turned ON. Therefore, the match line ML changes to level "0".

In addition, if the stored data of the CAM cell MC are set to data "0", data "1" is written in the storage node Nt1 of the SRAM cell SRCa, and data "0" is written in the storage node Nt1 of the SRAM cell SRCb. In this state, if the search data of the search line SLT are set to data "1" (i.e., if there is a mismatch), the MOS transistors MNa1 and MNa2 are both turned ON. Therefore, the match line ML changes to level "0". On the other hand, if the search data of the search line SLT are set to data "0" (i.e., if there is a match), the MOS transistor MNa2 and the MOS transistor MNb1 are turned OFF. Therefore, the match line ML maintains level "1".

Further, if the stored data of the CAM cell MC are set to "x" (don't-care), data "0" is written in the storage node Nt1 of both SRAM cells SRCa and SRCb. In this state, the MOS transistor MNa1 and the MOS transistor MNb1 are turned OFF. Therefore, no matter whether the search data of the search line SLT are set to data "1" or data "0", the match line ML maintains level "1". Note that a state in which the storage node Nt1 of the SRAM cells SRCa and SRCb are both set to data "1" is considered to be unused.

The examples shown in FIGS. 1 and 2 show a case where the CAM cell MC is a TCAM cell. However, the CAM cell MC is not to be limited a TCAM cell, and may be a SCAM (Binary CAM) cell. The BCAM cell stores the stored data of two values ("1", "0") in a single bit. In this case, only one word line WL coupled to each of the CAM entries ERY and only one SRAM cell shown in FIG. 2 are required.

Details of CAM Entry and Match Signal Output Circuit

Figure 3:
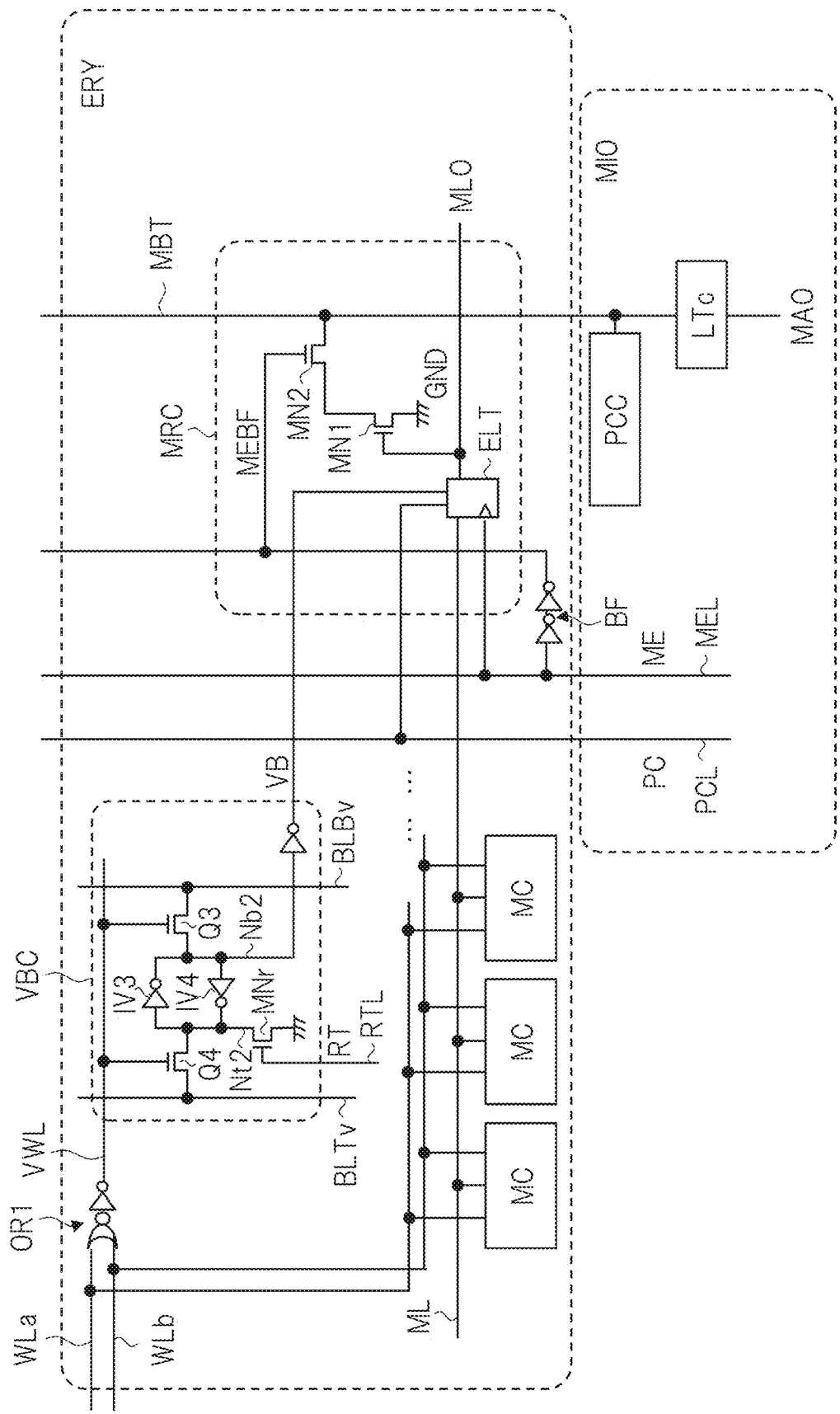
FIG. 3 is a circuit diagram showing a detailed configuration example of a main portion of each of the CAM entries and a match signal output circuit shown in FIG. 1.

FIG. 3 is a circuit diagram showing a detailed configuration example of a main portion of each of the CAM entries and the match signal output circuit shown in FIG. 1. In FIG. 3, the valid bit cell VBC in the CAM entry ERY comprises a latch circuit constituted by two inverters IV3 and IV4, two access transistors (such as nMOS transistors) Q3 and Q4, and a MOS transistor (nMOS transistor) for resetting NNE. The latch circuit and the access transistors Q3 and Q4 configure the SRAM cell.

The access transistor Q3 couples a storage node Nt2 of the latch circuit to a bit line for valid BLTv. The access transistor Q4 couples an inverted storage node Nb2 of the latch circuit to an inverted bit line for valid BLBv. The MOS transistor for resetting MNr couples the storage node Nt2 to the low potential side power source GND in response to a reset signal RT from a reset line RTL. The access transistors Q3 and Q4 are controlled to be turned ON or OFF by a word line for valid VWL.

The word line for valid VWL is coupled to an output of an OR gate OR1. The OR gate OR1 performs an OR operation on a voltage level of the A-series word line WLa and a voltage level of the B-series word line WLb, and outputs a voltage level representing the operation results to the word line for valid VWL. In such a configuration, for example, when the write operation of valid data VB to the valid bit cell VBC is performed, it is sufficient to activate the A-series word line WLa or the B-series word line WLb of the corresponding CAM entry ERY.

In addition, the match read cell MRC in the CAM entry ERY comprises an entry latch circuit. ELT and two MOS transistors (nMOS transistors) MN1 and MN2. In simple terms the entry latch circuit ELT latches the voltage level of the match line ML at the time of the search operation, and outputs it as a match output signal MLO. The two MOS transistors MN1 and MN2 are coupled in series between the common match output line MBT and the low potential-side power source GND.

The MOS transistor MN1 is controlled to be turned ON or OFF by the match output signal MLO (i.e., based on the voltage level of the match line ML). The MOS transistor MN2 is controlled to be turned ON or OFF by a match enabling signal ME. The match enabling signal ME is a signal that is asserted when the search operation is performed, and is transmitted via a match enabling line MEL. Specifically, in this example, the MOS transistor MN2 is controlled by a match enabling signal MEBF which is the match enabling signal ME buffered via a buffer BF.

The match signal output circuit MIO comprises a precharge circuit PCC and a latch circuit LTc. The precharge circuit PCC precharges the common match output line MBT to the precharge level (level "1"). The latch circuit LTc latches the voltage level of the common match output line MBT, and outputs it as the match all-out signal MAO. In addition, the match signal output circuit MIO outputs a precharge signal PC of the match line ML to a precharge line PCL, and outputs the match enabling signal ME to the match enabling line MEL. Although the precharge line PCL and the match enabling line MEL are not shown in FIG. 1, they are provided so as to be common to the plurality of CAM entries ERY[0]-ERY[m], extending in the row direction.

At the time of the search operation, the match signal output circuit MIO controls the match enabling signal MEBF to level "1". As a result, all of the MOS transistors MN2 in the plurality of CAM entries ERY[0]-ERY[m] are turned ON. On the other hand, the match ML in the plurality of CAM entries ERY[0]-ERY[m] is controlled to level "1" when there is a match, and is controlled to level "0" when there is a mismatch, as described above.

In this manner, if there is one or more matching (level "1") match line ML among the match lines ML in the plurality of CAM entries ERY[0]-ERY[m], the MOS transistor MN1 in the matching CAM entry ERY is turned ON. As a result, the common match output line MBT is controlled to a voltage level (level "0") of the low potential-side power source GND. On the other hand, if there is a mismatch (level "0") for all of the match lines ML in the plurality of CAM entries ERY[0]-ERY[m] the common match output line MBT maintains the precharge level (level "1") by the precharge circuit PCC.

Such a method makes it possible to discriminate whether or not there is a mismatch for all of the CAM entries ERY in the CAM unit CU1 shown in FIG. 1. In the method described in Patent Document 1, such a discrimination is performed using an OR gate with a multistage configuration that uses the match output signal MLO as input. In this case, the signal delay is large, and the circuit area and power consumption may also increase. On the other hand, in FIG. 3, such a discrimination is performed by providing the MOS transistors MN1 and MN2 and the common match output line MBT, thereby reducing the signal delay. In addition, such a discrimination can be performed with a small circuit area or low power consumption.

Figure 4:
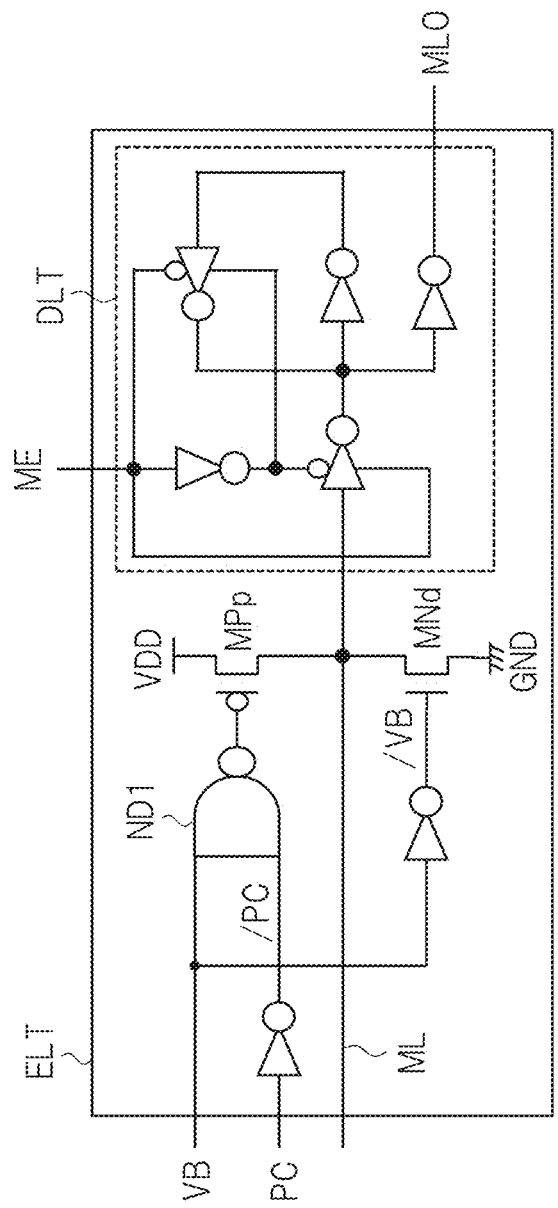
FIG. 4 is a circuit diagram sowing a detailed configuration example of an entry latch circuit shown in FIG. 3.

FIG. 4 is a circuit diagram showing a detailed configuration example of the entry latch circuit shown in FIG. 3. The entry latch circuit ELT shown in FIG. 4 comprises a NAND gate ND1, a MOS transistor (pMOS transistor) for precharging MPp, a MOS transistor (nMOS transistor) for discharging MNd, and a D-latch circuit DLT. First, a case where the valid data VB are set to level "1" (valid) will be described.

In this case, the NAND gate ND1 controls the pMOS transistor MPp to be ON during a level "0" period of the ID recharge signal PC (level "1" period of inverted signal (/PC)), and controls the pMOS transistor MPp to be OFF during the level "1" period of the precharge signal PC. On the other hand, the nMOS transistor MNd is fixed to be OFF based on inverted data (/VB) of the valid data VB. As a result, at the time of the search operation, the precharge signal PC transitions from level "0" to level "1" such that the match line ML is precharged to a voltage level (level "1") of a high potential-side power source VDD.

Next, a case where the valid data VP are set to level "0" (invalid) will be described. In this case, the NAND gate ND1 fixes the pMOS transistor MPp to be OFF. On the other hand, the nMOS transistor MNd is fixed to be ON based on the inverted data (/VB) of the valid data VB. As a result, the match line ML is fixed to the voltage level (level "0") of the low potential-side power source GND.

The D-latch circuit DLT is constituted by the plurality of inverters including a clocked inverter. The D-latch circuit DLT captures the voltage level of the match line ML in the level "1" period of the match enabling signal ME, and latches the captured voltage level at the time of transition from level "1" to level "0" of the match enabling signal ME. Then, the D-latch circuit. DLT outputs this latched (or captured) voltage level as the match output signal MLO.

Main Effects of First Embodiment

As described above, using the semiconductor device of the first embodiment typically allows the signal delay to be reduced. Specifically, the signal delay can be reduced when discriminating whether or not there is a mismatch for all of the CAM entries ERY. As a result, a quicker search operation can be obtained, especially in a semiconductor device that divides the search data SD as shown in FIG. 1. In addition, discrimination on whether or not there is a mismatch can be performed with a small circuit area or low power consumption.

Here, an example in which the match all-out signal MAO shown in FIG. 3 is applied to the semiconductor device that uses a method of dividing the search data SD as shown in FIG. 1 has been described. However, the match all-out signal MAO is not limited to be used in such an application, and can be applied to other applications. For example, the priority encoder PREN shown in FIG. 1 can be controlled to be activated or deactivated based on the match all-out signal MAO. In other words, if there is a mismatch for all of the CAM entries ERY, the priority encoder PREN can be deactivated to reduce power consumption.

In addition, in FIG. 3, nMOS transistors for coupling the common match output line MBT to the low potential-side power source GNP are used as the MOS transistors MN1 and MN2 in the match read cell MRC to. However, for example, pMOS transistors for coupling the common match output line MBT to the high potential-side power source VDD can be used. In other words, it can be configured such that the voltage level (level "1" or level "0") of the common match output line MBT is switched as necessary. However, from the viewpoint of speed, it is more desirable to use nMOS transistors.

Second Embodiment

Overview of Main Portion of Semiconductor Device

Figure 5:
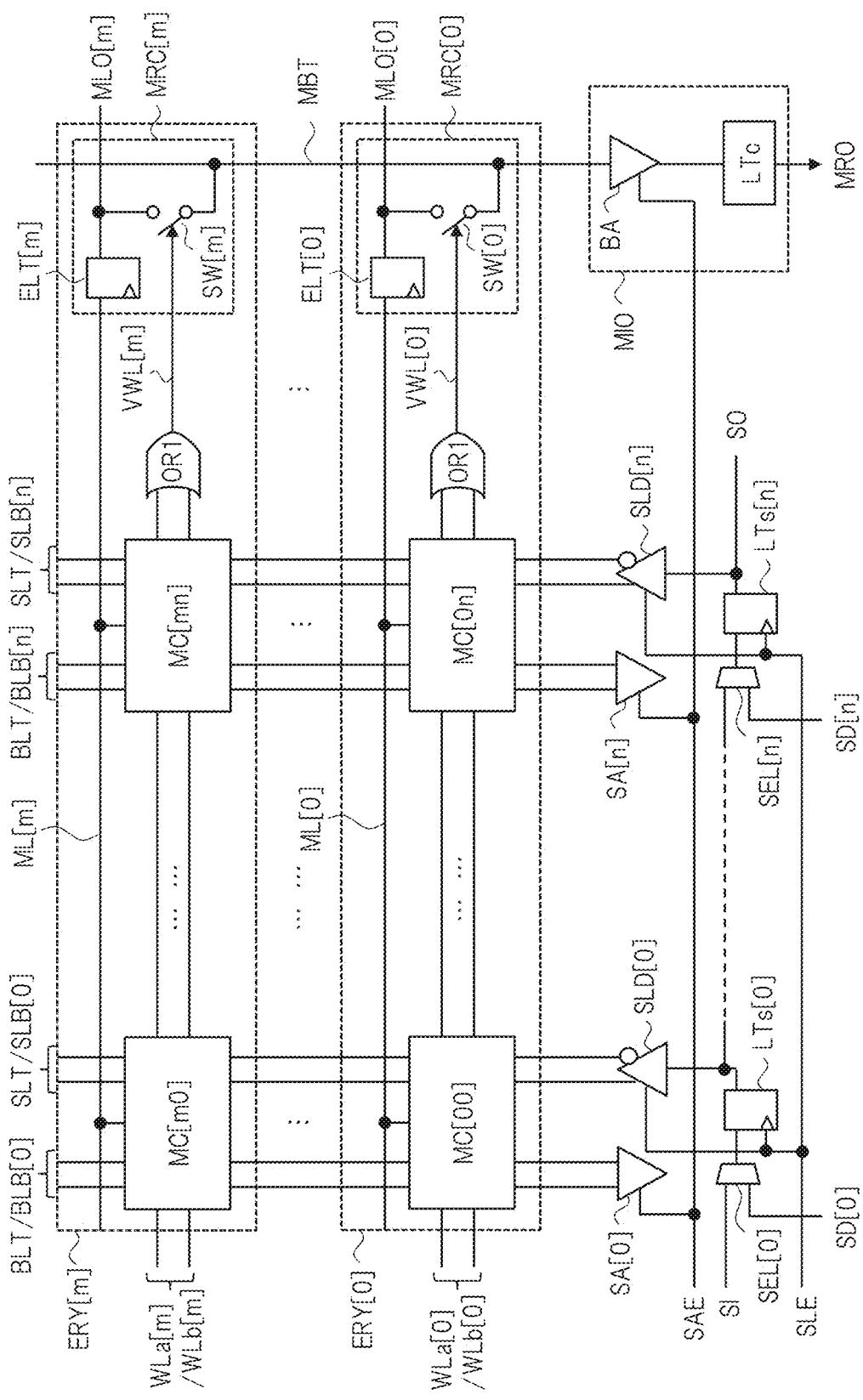
FIG. 5 is a schematic view showing a configuration example of a semiconductor device according to a second embodiment of the present invention, with a portion shown in FIG. 1 extracted.

FIG. 5 is a schematic view showing a configuration example of a semiconductor device according to a second embodiment of the present invention, with a portion shown in FIG. 1 extracted. FIG. 5 shows various configuration examples relating to test operations. In FIG. 5, each of the plurality (m+1) of CAM entries ERY[0]-ERY[m] comprises a plurality (n+1) of CAM cell MC and the OR gate OR1 shown in FIG. 3, and each of the CAM entries ERY[0]-ERY[m] comprises the match read cells MRC[0]-MRC[m] including the entry latch circuits ELT[0]-ELT[m] as shown in FIG. 3.

Further, in FIG. 5, the plurality (n+1) of sense amplifiers SA[0]-SA[n], search line drivers SLD[0]-SLD[n], latch circuits LTs[0]-Ls[n] and selectors SEL[0]-SEL[n] are provided so as to correspond to the plurality (n+1) of CAN cells MC. At the time of the read operation, the sense amplifiers SA[0]-SA[n] respectively amplify the readout signals of the stored data that are read out from the selected CAM entry ERY to the n+1 numbers of bit line pairs (BLT/BLB[0]-BLT/BLB[n]).

The search line drivers SLD[0]-SLD[n] respectively drive n+1 number of search line pairs (SLT/SLB[0]-SLT/SLB[n]) based on the search data SD[0]-SD[n] of the n+1 number of bits held by the latch circuits LTs[0]-LTs[n]. The latch circuits LTs[0]-LTs[n] configure a scan chain via the selectors SEL[0]-SEL[n]. The selectors SEL[0]-SEL[n] select whether to input the output from the previous latch circuit or to input the search data SD[0]-SD[n] from outside the semiconductor device to the latch circuits LTs[0]-LTs[n].

In addition, each of the match read cells MRC[0]-MRC[m] in the plurality of CAM entries ERY[0]-ERY[m] comprises switches SW[0]-SW[m]. The switches SW[0]-SW[m] are controlled to be turned ON or OFF by the word lines for valid VWL[0]-VWL[m] from the OR gate OR1. Each of the switches SW[0]-SW[m] has a function that outputs the corresponding match output signals MLO[0]-MLO[m] to the common match output line MBT when controlled to be ON.

The match signal output circuit MIO comprises a buffer amplifier (sense amplifier) BA and the latch circuit LTc. The buffer amplifier BA amplifies the voltage level of the common match output line MBT. Together with the sense amplifiers SA[0]-SA[n], the buffer amplifier BA is controlled to be activated or deactivated by a sense amplifier enabling signal SAE. The latch circuit LTc latches an output signal of the buffer amplifier BA, and outputs the latch result as a match readout signal MRO.

In such a configuration, for example, the following operations are performed during the test operation. First, data "0" is written to all of the CAM cells MC in the CAM entries ERY[0]-ERY[m] in advance. In addition, using a scan-in signal SI, data "1" is stored in the latch circuit LTs[0], and data "0" is stored in the remaining latch circuits (LTs[1]-LTs[n]). In other words, a state in which there is only one mismatching bit in each of the CAM entries ERY is established.

In this state, the CAM entries ERY[0]-ERY[m] are selected one by one by the word line WL (word line for valid VWL). Then, each time one of the CAM entries ERY[0]-ERY[m] is selected, the match output signal MLO of the selected CAM entry ERY is output to the common match output line MBT via the corresponding switch SW[0]-SW[m]. The match signal output circuit MIO outputs this match output signal MLO as the match readout signal MRO. This match readout signal MRO is used to determine pass or fail for each of the CAM entries ERY.

Thereafter, a similar test operation is performed while the latch circuits LTs[0]-LTs[n] that store data "1" are shifted one by one by using a search enabling signal SLE. Further, a similar test operation is performed with data "0" and data "1" being replaced with each other. Although not shown in the drawings, such a test operation can be performed by installing a BIST (Built In Self Test) circuit or the like in the semiconductor device.

Note that, in this example, the switches SW[0]-SW[m] output the match output signals MLO[0]-MLO[m] of the CAM entries ERY[0]-ERY[m] to the common match output line MBT during the test operation. However, this is not necessarily limited to the test operation, and in actual use, the switches SW[0]-SW[m] can also be used when referring to the match output signal MLO of a particular CAM entry ERY. In other words, the switches SW[0]-SW[m] can be used at the time of the read operations for various purposes.

Details of CAM Entry and Match Signal Output Circuit [1]

Figure 6:
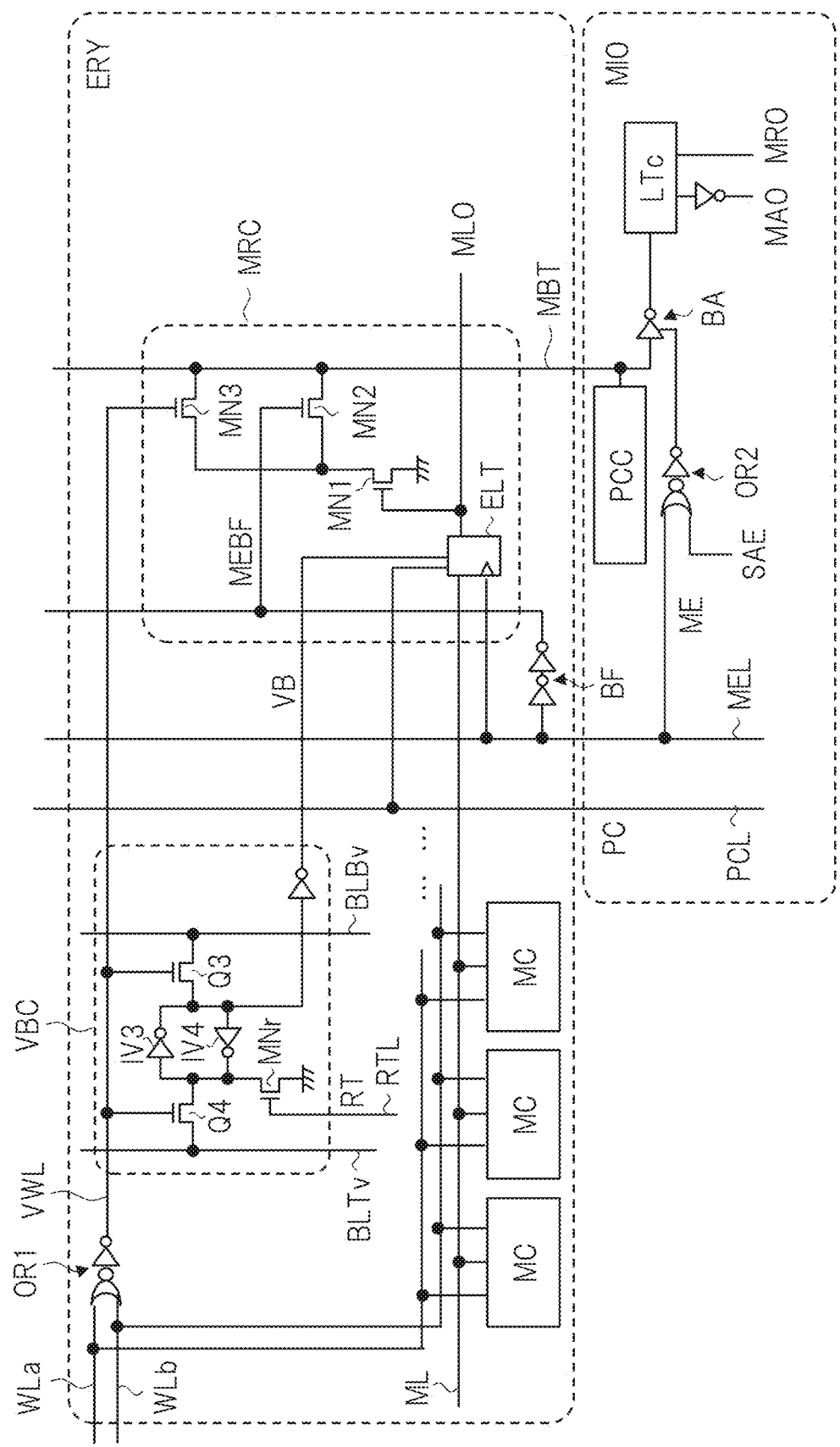
FIG. 6 is a circuit diagram showing a detailed configuration example of a main portion of each of the CAM entries and the match signal output circuit, implementing FIG. 5.

FIG. 6 is a circuit diagram showing a detailed configuration example of a main portion of each of the CAM entries and the match signal output circuit, implementing FIG. 5. In FIG. 6, the CAM entry ERY has the match read cell MRC that differs in configuration from the configuration example shown in FIG. 3. This match read cell MRC has a configuration in which a MOS transistor (nMOS transistor) MN3 corresponding to each of the switches SW[0]-SW[m] shown in FIG. is added to the configuration example shown in FIG. 3. The MOS transistor MN3 is coupled in parallel to the MOS transistor MN2, and is controlled to be turned ON or OFF by the word line for valid VWL.

In addition, in FIG. 6, the match signal output circuit MIO has a configuration in which an OR gate OR2 and the buffer amplifier (sense amplifier) BA described with reference to FIG. 5 are added to the configuration example shown in FIG. 3. Further, the latch circuit LTc in the match signal output circuit MIO differs from the configuration example shown in FIG. 3 in that, in addition to the match all-out signal MAO, the match readout signal MRO described with reference to FIG. 5 is output. The buffer amplifier BA is provided upstream of the latch circuit LTc, amplifies the voltage level of the common match output line MBT, and outputs it to the latch circuit LTc. The OR gate OR2 performs the OR operation of the match enabling signal ME and the sense amplifier enabling signal SAE, and controls activation or deactivation of the buffer amplifier BA based on the operation results.

In such a configuration, at the time of the search operation, the MOS transistor MN3 is turned OFF. On the other hand, as in the case shown in FIG. 3, the MOS transistor MN2 is turned ON, and the voltage level of the common match output line MBT is determined in response to whether or not there is a mismatch for all of the CAM entries ERY. When the match enabling signal ME is asserted, the buffer amplifier BA amplifies the voltage level of this common match output line MBT. The latch circuit LTc latches an output signal of the buffer amplifier BA, and outputs it as the match all-out signal MAO. In this example, if the voltage level of the common match output line MBT is level "1" (if there is a mismatch for all of the CAM entries ERY), the match all-out signal MAO of level "1" is output.

In addition, as described with reference to FIG. 5, at the time of the test operation (read operation), the predetermined search data SD is first input with the predetermined data written to all of the CAM cells MC such that a voltage level of the match output signal MLO is latched by the entry latch circuit ELT. In this state, precharging of the common match output line MBT by the precharge circuit PCC and selection of the CAM entry ERY are performed.

At this time, the CAM entry ERY is selected by activating the A-series word line WLa or the B-series word line WLb, and the MOS transistor MN3 is turned ON via the word line for valid VWL. On the other hand, the MOS transistor MN2 is turned OFF since the match enabling signal ME is negated to level "0". As a result, if the match output signal MLO of the selected CAM entry ERY is at level "1" (match), the common match output line MBT is changed from level "1" (precharge level) to level "0" by the MOS transistor MN1 being turned ON.

On the other hand, if the match output signal MLO of the selected CAM entry ERY is at level "0" (mismatch), the common Match output line MBT maintains level "1" (precharge level) by the MOS transistor MN1 being turned OFF. When the sense amplifier enabling signal SAE is asserted, the buffer amplifier BA amplifies the voltage level of this common match output line MBT. The latch circuit LTc latches the output signal of the buffer amplifier BA, and outputs it as the match readout signal MRO. In this example, if the voltage of the common match output line MBT is at level "1" (if there is a mismatch for the selected CAM entry ERY), the match readout signal MRO of level "0" is output.

Using the configuration example as shown in FIG. 6 allows the common match output line MBT and each of the circuits (PCC, BA, LTc) in the match signal output circuit MIO to be shared when the match all-out signal MAO is output at the time of the search operation, and when the match readout signal MRO is output at the time of the read operation. As a result, the circuit area can be reduced.

Details of CAM Entry and Match Signal Output Circuit [2]

Figure 7:
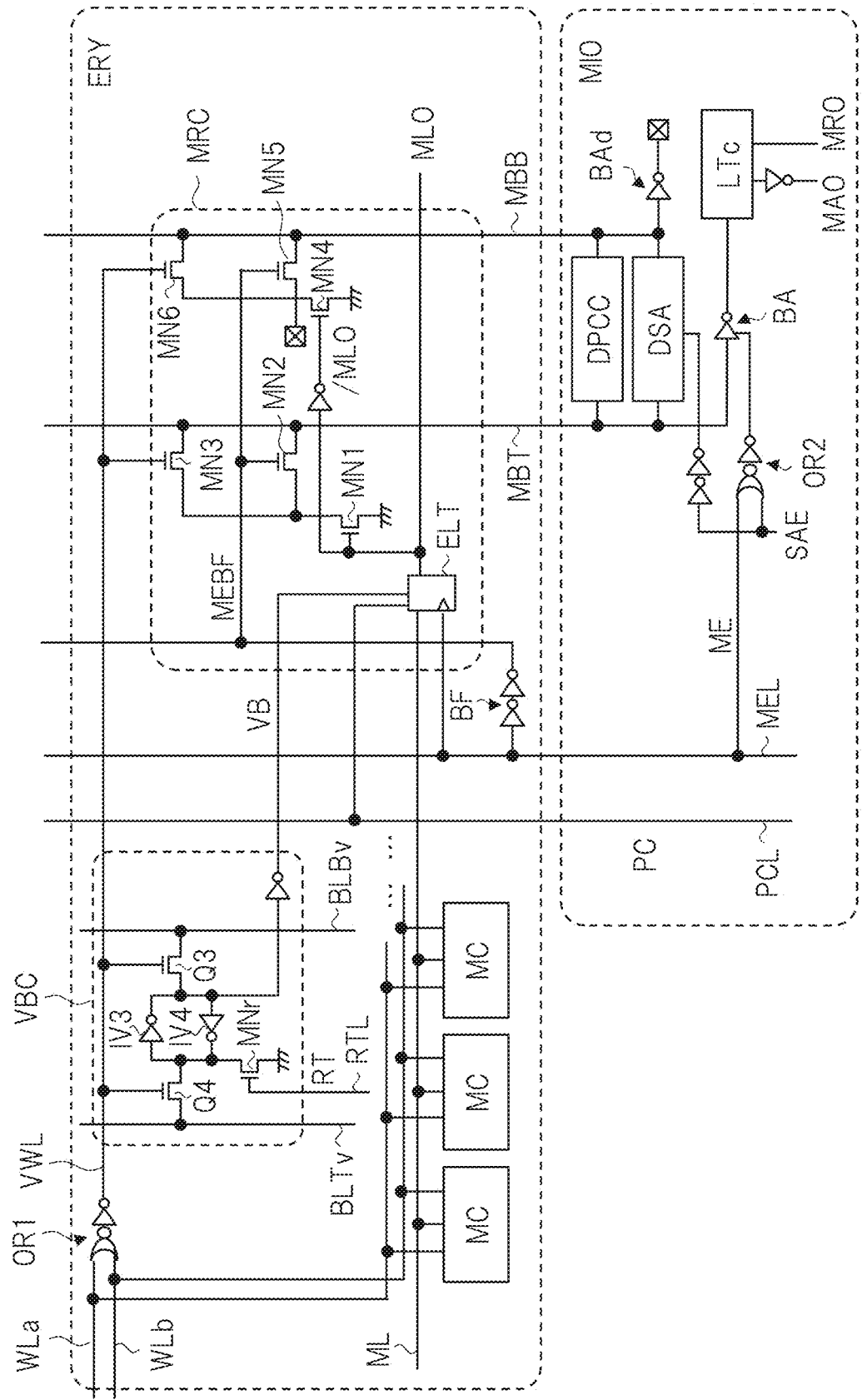
FIG. 7 is a circuit diagram showing a configuration example modified from, FIG. 6.

FIG. 7 is a circuit diagram showing a configuration example modified from FIG. 6. The configuration example shown in FIG. 7 differs from the configuration example shown in FIG. 6 in that a readout method at the time of the read operation is changed to a differential type. In FIG. 7, in addition to the common match output line MBT, an inverted common match output line MBB as its differential counterpart is provided. The match read cell NRC further comprises MOS transistors (nMOS transistors) MN4, MN5 and MN6 as compared to the configuration example shown in FIG. 6.

The MOS transistors MN4, MN5 and MN6 are provided for the inverted common match output line MBB so as to respectively correspond to the MOS transistors MN1, MN2 and MN3 on the side of the common match output line MBT. As in the MOS transistors MN1 and MN3, the MOS transistors MN4 and MN6 are coupled in series between the inverted common match output line MBB and the low potential-side power source GND. The MOS transistor MN4 configures a differential pair with the MOS transistor MN1, and is controlled to be turned ON or OFF by an inverted signal (/MLO) of the match output signal MLO. The MOS transistor MN6 is controlled to be turned ON or OFF together with the MOS transistor MN3 by the word line for valid VWL.

The MOS transistor MN5 has one end (drain) coupled to the inverted common match output line MBB, and is controlled to be turned ON or OFF together with the MOS transistor MN2 by the match enabling signal MEBF. However, the MOS transistor MN5 has the other end (source) open and not coupled to the MOS transistor MN4. In this example, the MOS transistor MN5 is essentially unnecessary since a single-end readout is performed at the time of the search operation. However, it is desirable to maintain a differential balance (such as balance of parasitic capacitance) in relation to the MOS transistor MN2 when the differential readout is performed at the time of the read operation. Therefore, the MOS transistor MN5 is provided as a dummy transistor of the MOS transistor MN2.

The match signal output circuit MIO differs from the configuration example shown in FIG. 6 in the following manner. First, the match signal output circuit MIO comprises a differential precharge circuit DPCC and a differential type sense amplifier DSA that are coupled to the common match output line MBT and the inverted common match output line MBB. In addition, a dummy buffer amplifier BAd acting as a dummy of the buffer amplifier BA is coupled to the inverted common match output line MBB.

The differential precharge circuit DPCC is provided instead of the precharge circuit PCC shown in FIG. 6, and precharges both the common match output line MBT and the inverted common match output line MBB to level "1". The differential type sense amplifier DSA is controlled to be activated or deactivated by the sense amplifier enabling signal SAE (specifically, the signal that buffers it). When the sense amplifier enabling signal SAE is asserted, the differential type sense amplifier DSA amplifies a differential voltage between the voltage level of the common match output line MBT and a voltage level of the inverted common match output line MBB.

In such a configuration, at the time of the search operation, a similar operation as in the case shown in FIG. 6 is performed via the common match output line MBT. At this time, the differential type sense amplifier DSA is controlled only by the sense amplifier enabling signal SAE, and thus maintains an inactive state. On the other hand, at the time of the test operation (read operation), in addition to the common match output line MBT being controlled by a path of the MOS transistors MN1 and MN3 the inverted common match output line MBB is controlled by a path of the MOS transistors MN4 and MN6.

At this time, the MOS transistor MN1 and the MOS transistor MN4 are controlled to be turned ON or OFF in a complementary manner. As a result, one of the common match output line MBT and inverted common match output line MBB changes toward level "0", and the other maintains level "1" (precharge level). The differential type sense amplifier DSA amplifies the differential voltage obtained in such a manner in response to the assertion of the sense amplifier enabling signal SAE. The buffer amplifier BA further amplifies the voltage level of the common match output line MBT amplified by the differential type sense amplifier DSA in response to the assertion of the sense amplifier enabling signal SAE.

Using the configuration example as shown in FIG. 7 allows the common match output line MBT and each of the circuits (DPCC, BA, LTc) in the match signal output circuit MIO to be shared when the match all-out signal MAO is output at the time of the search operation, and when the match readout signal MRO is output at the time of the read operation. As a result, the circuit area can be reduced. Further, using the differential type sense amplifier DSA at the time of the read operation allows a readout speed to speed up when the match readout signal MRO is output. As a result, for example, a shorter test time and the like can be obtained.

Details of CAM Entry and Match Signal Output Circuit [3]

Figure 8:
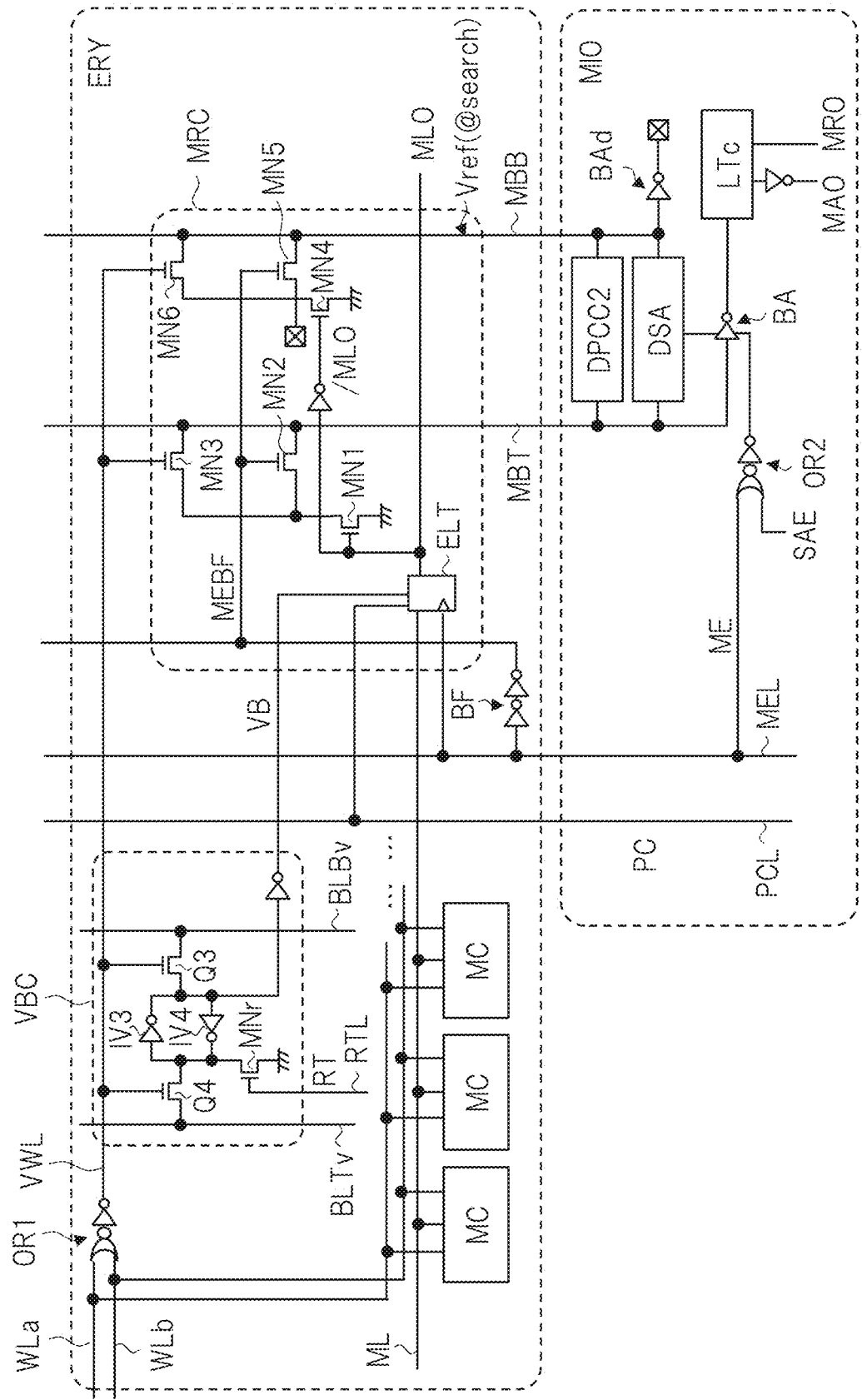
FIG. 8 is a circuit diagram showing a configuration example modified from FIG. 7.

FIG. 8 is a circuit diagram showing a configuration example modified from FIG. 7. The configuration example shown in FIG. 8 differs from the configuration example shown in FIG. 7 in that the readout methods at the time of the read operation and at the time of the search operation are changed to the differential type. Accordingly, the differential type sense amplifier DSA in the match signal output circuit MIO shown in FIG. 8 is controlled to be activated or deactivated by an operation result of the OR gate OR2 (i.e., the match enabling signal ME or the sense amplifier enabling signal SAE), as in the buffer amplifier BA.

In such a configuration, at the time of the test operation (read operation), a similar operation as in the case shown in FIG. 7 is performed. On the other hand, at the time of the search operation, unlike in the case shown in FIG. 7, a differential precharge circuit DPCC2 precharges the common match output line MBT to level "1" (voltage level of high potential side power source VDD), and precharges the inverted common match output line MBB to a reference voltage level Vref. The reference voltage level Vref is an intermediate voltage level (VDD/2) between level "0" (voltage level of low potential-side power source GND) and level "1".

In this state, if there is a matching CAM entry ERY, the common match output line MBT changes from level "1" to level "0". On the other hand, if there is a mismatch for all of the CAM entries ERY, the common match output line MBT maintains level "1". The differential type sense amplifier DSA amplifies the voltage level of the common match output line MBT in response to the assertion of the match enabling signal ME and based on the reference voltage level Vref of the inverted common match output line MBB. In addition, the buffer amplifier BA further amplifies the voltage level of the common match output line MBT amplified by the differential type sense amplifier DSA in response to the assertion of the match enabling signal ME.

Using the configuration example as shown in FIG. 8 allows the differential type sense amplifier DSA to be used to perform an amplification operation at the time of the read operation similar to the case shown in FIG. 7 and at the time of the search operation. This allows the readout speed to speed up when the match all-out signal MAO is output and when the match readout signal MRO is output. In other words, the signal delay can be further reduced until the match all-out signal MAO is obtained.

Main Effects of Second Embodiment

As described above, using the semiconductor device of the second embodiment provides effects similar to those of the first embodiment. In addition, sharing each of the circuits of the readout system between the read operation and the search operation allows an increase in the circuit area to be suppressed. Further, using the differential type sense amplifier DSA at the time of the search operation allows the signal delay to be further reduced compared to the method of the first embodiment.

Third Embodiment

Details of CAM Entry and Match Signal Output Circuit

Figure 9:
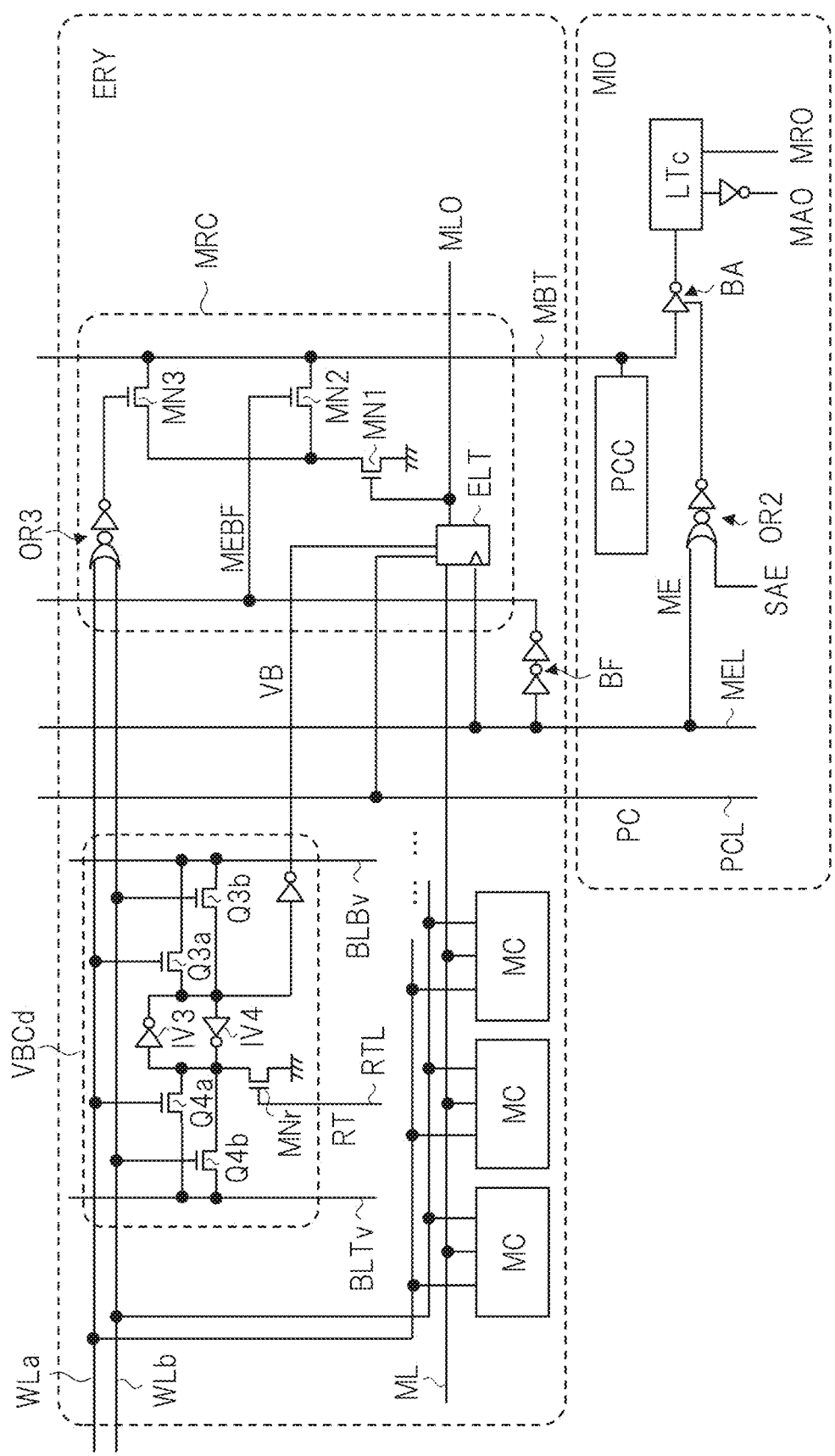
FIG. 9 is a circuit diagram showing a detailed configuration example of a main portion of each of the CAM entries and the match signal output circuit shown in FIG. 1 for a semiconductor device according to a third embodiment of the present invention.

FIG. 9 is a circuit diagram showing a detailed configuration example of a main portion of each of the CAM entries and the match signal output circuit shown in FIG. 1 for a semiconductor device according to a third embodiment of the present invention. The configuration example shown in FIG. 9 has a valid bit cell VBCd in the CAM entry ERY that differs in configuration from the configuration example shown in FIG. 6.

In FIG. 9, the valid bit cell VBCd comprises two access transistors (such as nMOS transistors) Q3a and Q3b coupled in parallel instead of the access transistor (such as an nMOS transistor) Q3 in FIG. 6. Likewise, the valid bit cell VBCd comprises two access transistors (such as nMOS transistors) Q4a and Q4b coupled in para instead of the access transistor (such as an nMOS transistor) Q4 in FIG. 6.

The access transistors Q3a and Q4a are controlled to be turned ON or OFF by the A-series word line WLa. The access transistor Q3b and Q4b are controlled to be turned ON or OFF by the B-series word line WLb. In this manner, the valid bit cell VBCd shown in FIG. 9 is a dual-port type valid bit cell that is accessed by the A-series word line WLa or the B-series word line WLb.

Accordingly, the match read cell MRC shown in FIG. 9 comprises an OR gate OR3. The OR rate OR3 is provided instead of the OR gate OR1 shown in FIG. 6. The OR gate OR3 performs the OR operation of the voltage level of the A-series word line WLa and the voltage level of the B-series word line WLb, and controls ON or OFF of the MOS transistor MN3 with the voltage level which is the operation result.

Figure 10:
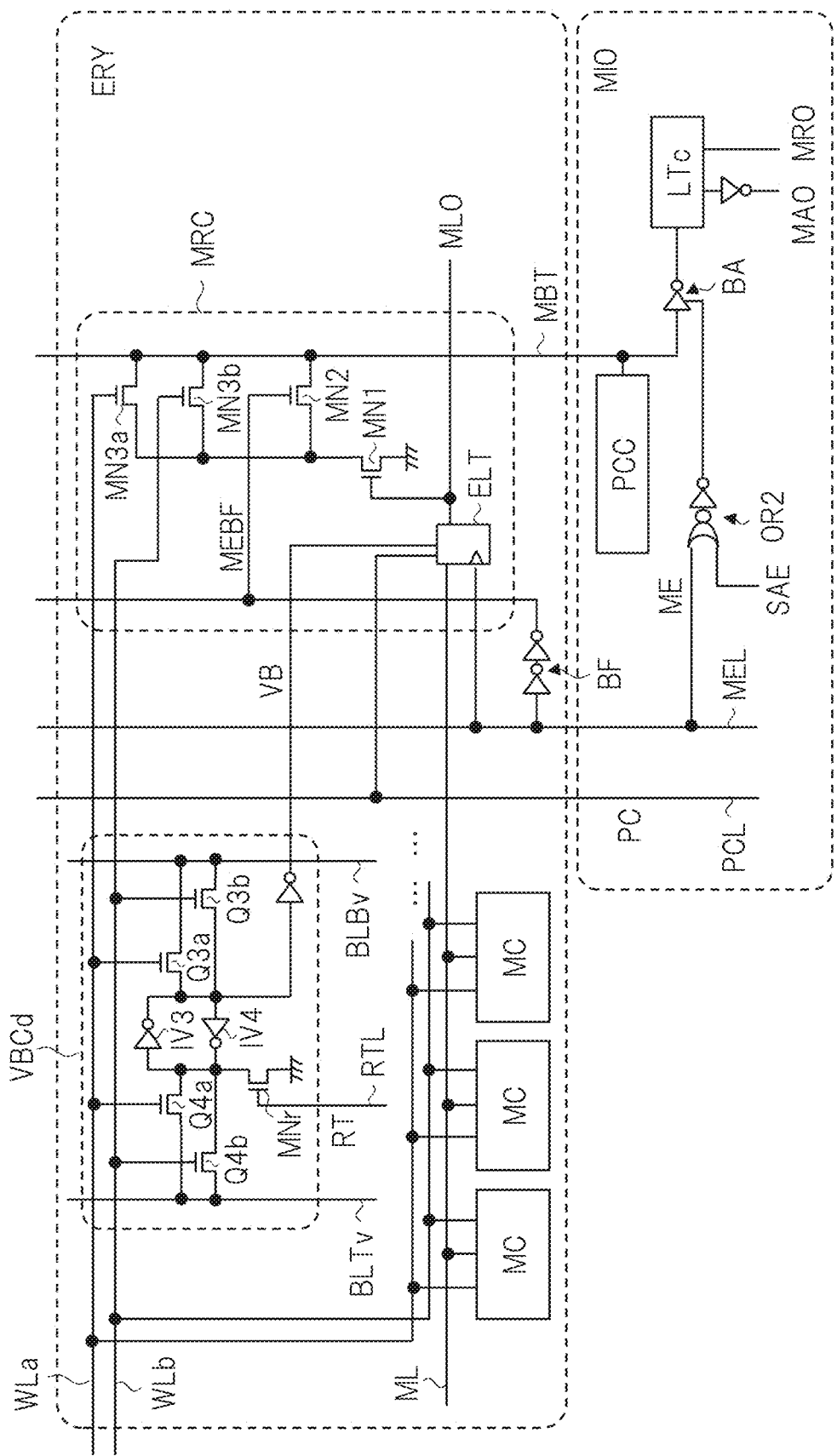
FIG. 10 is a circuit diagram showing a configuration example modified from FIG. 9.

FIG. 10 is a circuit diagram showing a configuration example modified from FIG. 9. In the configuration example shown in FIG. 10, the MOS transistor MN3 in the match read cell MRC shown in FIG. 9 is constituted by two MOS transistors such as nMOS transistors) MN3a and MN3b coupled in parallel. The MOS transistor MN3a is controlled to be turned ON or OFF by the A-series word line WLa. The MOS transistor MN3b is controlled to be turned ON or OFF by the B-series word line WLb. Accordingly, in FIG. 10 the OR gate OR3 shown in FIG. 9 is unnecessary.

Figure 11:
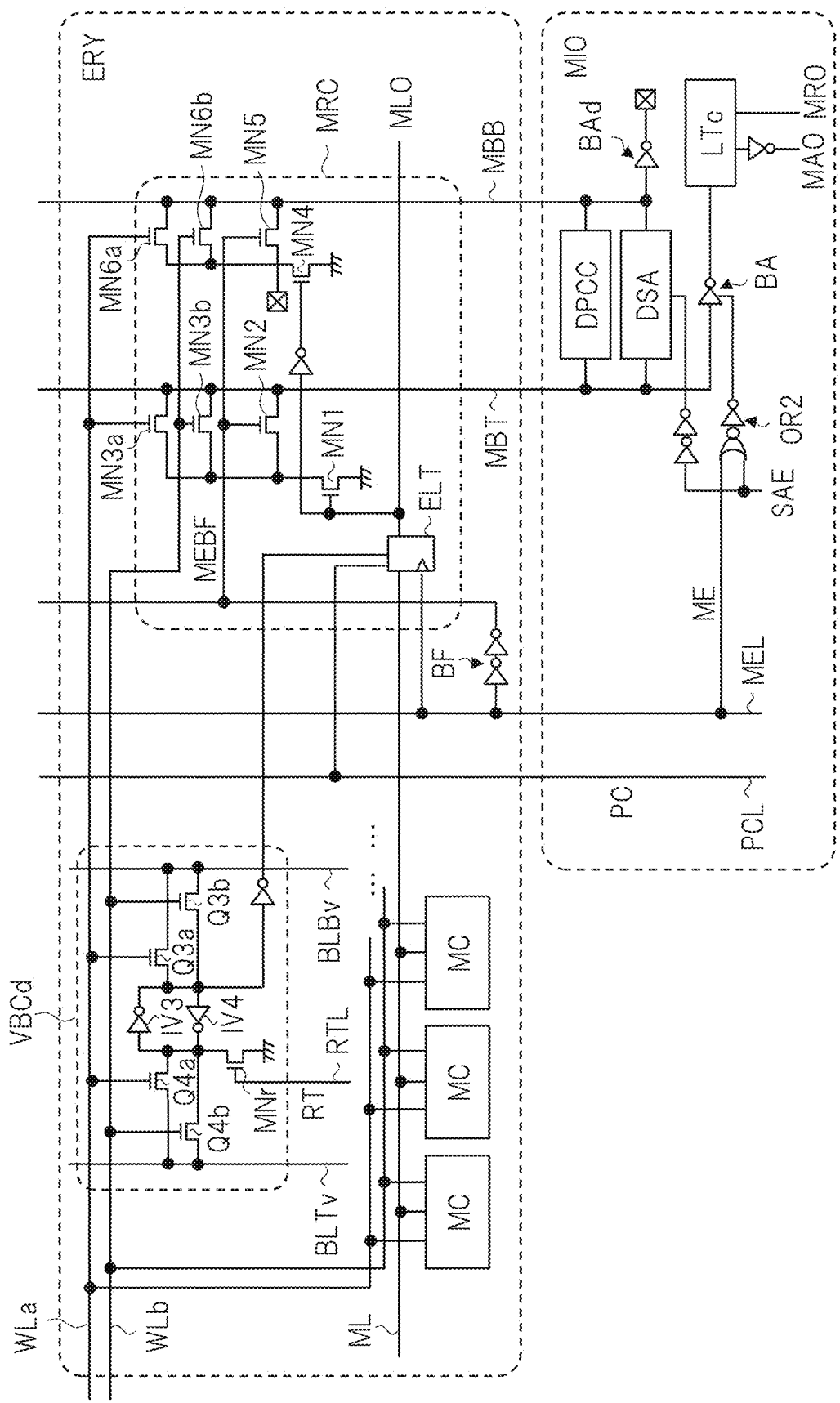
FIG. 11 is a circuit diagram showing a configuration example modified from FIG. 10.

FIG. 11 is a circuit diagram showing a configuration example modified from FIG. 10. As in the cases shown in FIGS. 6 and 7, the configuration example shown in FIG. 11 differs from the configuration example shown in FIG. 10 in that the readout method at the time of the read operation is changed to the differential type. Accordingly, the match read cell MRC in the CAM entry ERY comprises MOS transistors (such as nMOS transistors) MN4, MN5, MN6a and MN6b. The MOS transistors MN4, MN5, MN6a and MN6b are provided for the inverted common match output line MBB so as to respectively correspond to the MOS transistors MN1, MN2, MN3a and MN3b on the side of the common match output line MBT. The configuration and operation of the match signal output circuit MIO are similar to those in the case shown in FIG. 7.

Figure 12:
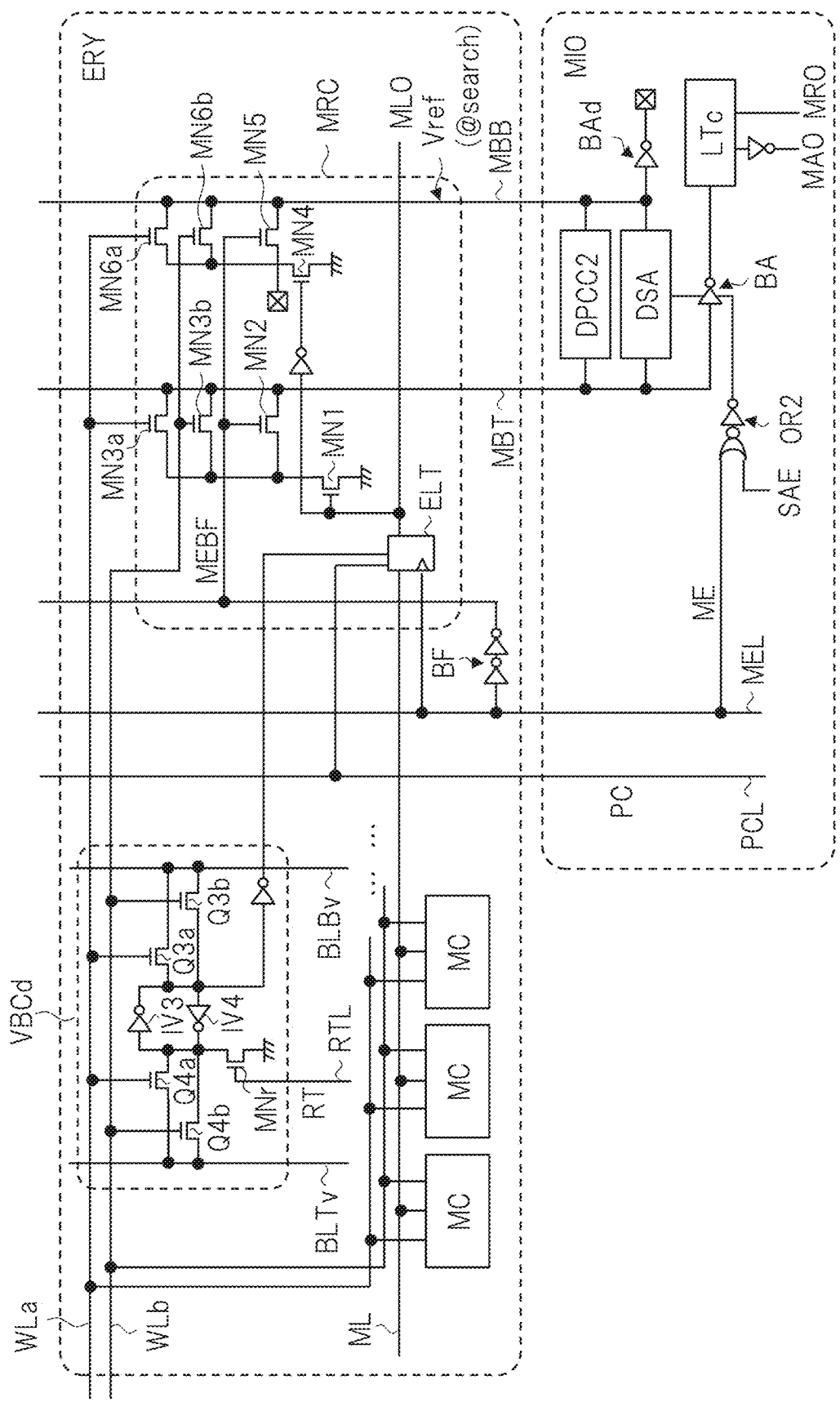
FIG. 12 is a circuit diagram showing a configuration example modified from, FIG. 11.

FIG. 12 is a circuit diagram showing a configuration example modified from FIG. 11. As in the cases shown in FIGS. 7 and 8, the configuration example shown in FIG. 12 differs from the configuration example shown in FIG. 11 in that the readout methods at the time of the search operation and at the time of the read operation are changed to the differential type. Accordingly, the configuration and operation of the match signal output circuit MIO are similar to those in the case shown in FIG. 8.

Main Effects of Third Embodiment

As described above, using the semiconductor device of the third embodiment provides effects similar to those of the second embodiment. Further, such effects can be obtained even in a case where the dual-port type valid bit cell VBCd is used. In addition, in FIGS. 10 to 12, the OR gate that performs the OR operation for the voltage levels of the A-series word line WLa and B-series word line WLb can be deleted.

Fourth Embodiment

Details of Valid Bit Cell

Figure 13A:
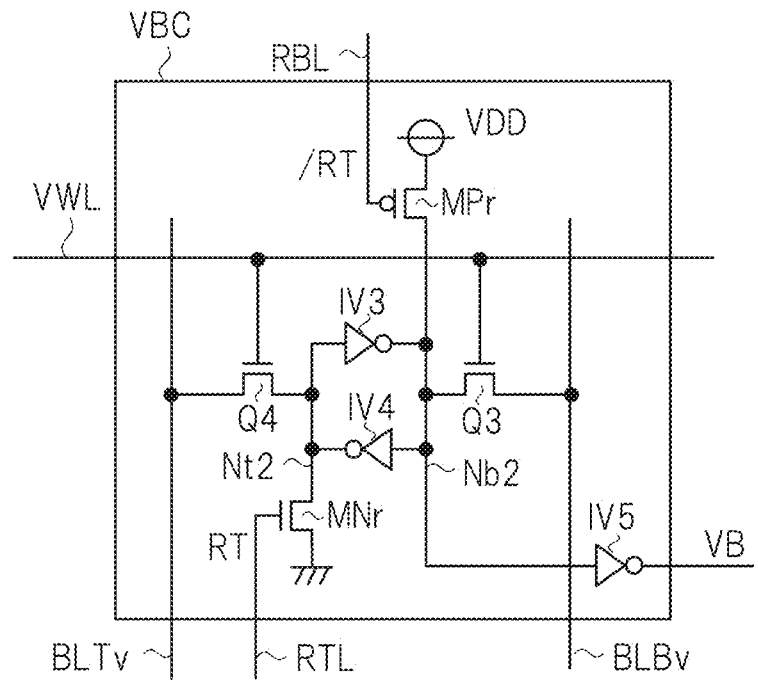
FIG. 13A is a circuit diagram showing a configuration example of a valid bit cell shown in FIG. 1 for a semiconductor device according to a fourth embodiment of the present invention.

FIG. 13A is a circuit diagram showing a configuration example of a valid bit cell shown in FIG. 1 for a semiconductor device according to a fourth embodiment of the present invention. FIG. 13A shows a single-port type valid bit cell VBC that partially differs from those shown in FIG. 6 and the like. The valid bit cell VBC shown in FIG. 13A has latch circuits (IV3 and IV4) including the storage node Nt2 and the inverted storage node Nb2, the access transistors (nMOS transistors) Q3 and Q4, two MOS transistors for resetting MNr and MPr, and an inverter IV5. In other words, this valid bit cell VBC comprises the MOS transistor for resetting MNr shown in FIG. 6 and the like and another MOS transistor for resetting MPr.

One inverter IV3 that partially configures the latch circuit operates with the storage node Nt2 as the input and the inverted storage node Nb2 as the output. The other inverter IV4 that partially configures the latch circuit operates with the inverted storage node Nb2 as the input and the storage node Nt2 as the output. The access transistor Q3 is coupled between the inverted storage node Nb2 and the inverted bit line for valid BLBv, and is controlled to be turned ON or OFF by the word line for valid VWL. The access transistor Q4 is coupled between the storage node Nt2 and the bit line for valid BLTv, and is controlled to be turned ON or OFF by the word line for valid VWL. The inverter IV5 operates with the inverted storage node Nb2 as the input, and outputs the valid data VB.

The MOS transistor for resetting MNr is a nMOS transistor, and the MOS transistor for resetting MPr is a pMOS transistor. The MOS transistor for resetting MNr is coupled between the storage node Nt2 and the low potent-side power source GND, and is controlled to be turned ON or OFF by the reset signal RT from the reset line RTL. On the other hand, the MOS transistor for resetting MPr is coupled between the inverted storage node Nb2 and the high potential-side power source VDD, and is controlled to be turned ON or OFF by an inverted reset signal (/RT) from an inverted reset line RBL.

Figure 13B:
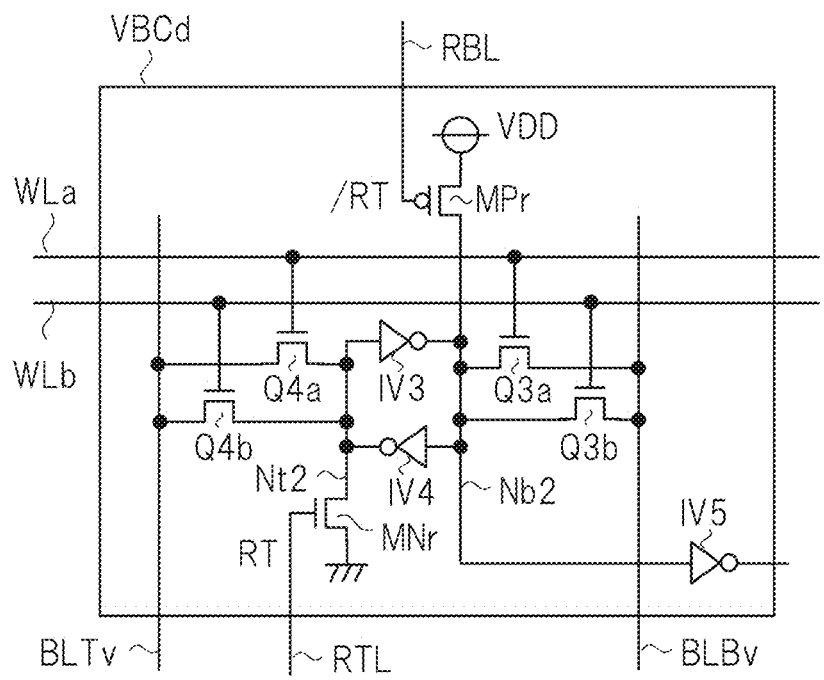
FIG. 13B is a circuit diagram showing a configuration example of a valid bit cell that differs from that shown in FIG. 13A.

FIG. 13B is a circuit diagram showing a configuration example of a valid bit cell that differs from that shown in FIG. 13A. FIG. 13B shows a dual-port type valid bit cell VBCd that partially differs from those shown in FIG. 9 and the like. In FIG. 13B, the access transistor Q3 shown in FIG. 13A is constituted by two access transistors Q3a and Q3b coupled in parallel. Likewise, the access transistor Q4 shown in FIG. 13A is constituted by two access transistors Q4a and Q4b coupled in parallel.

The access transistors Q3a and Q4a are controlled to be turned ON or OFF by the A-series word line WLa. The access transistors Q3b and Q4b are controlled to be turned ON or OFF by the B-series word line WLb. As in the case shown in FIG. 13A, the valid bit cell VBCd comprises the MOS transistor for resetting MNr shown in FIG. 9 and the like and another MOS transistor for resetting MPr.

Figure 14:
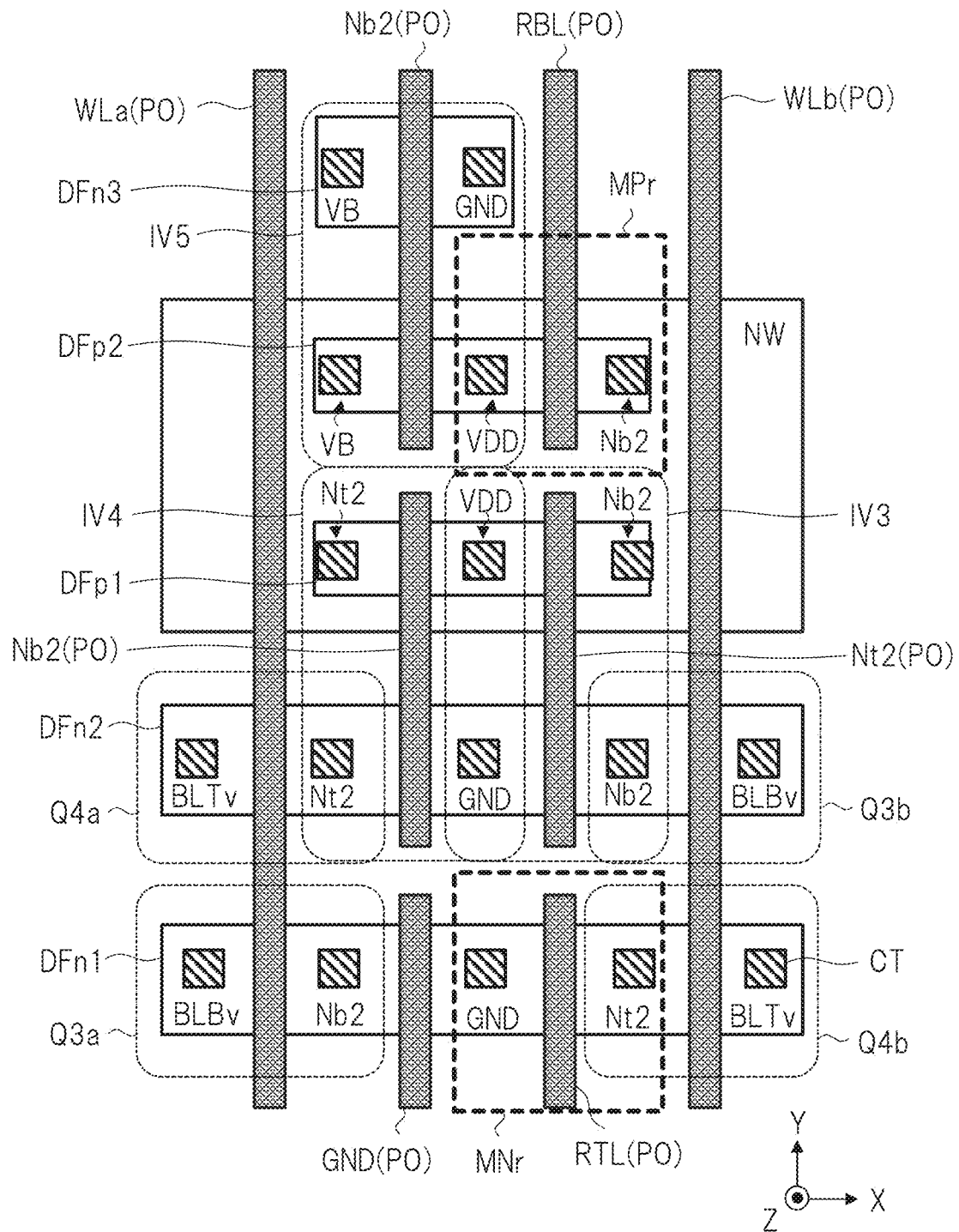
FIG. 14 is a plan view showing a layout configuration example of a main portion in the valid bit cell shown in FIG. 13B.

FIG. 14 is a plan view showing a layout configuration example of a main portion in the valid bit cell shown in FIG. 13B. In FIG. 14, an n-type diffusion layer DFn1, an n-type diffusion layer DFn2, an n-type well NW and an n-type diffusion layer DFn3 are formed in this order toward a Y direction. In the n-type well NW, a p-type diffusion layer DFp1 and a p-type diffusion layer DFp2 are formed in this order toward the Y direction.

In addition, in an upper (Z direction) portion of each of the diffusion layers, a plurality of polysilicon layers PO are formed so as to extend toward the Y direction and be arranged side by side in an X direction. The plurality of polysilicon layers PO allows the A-series word line WLa (PO) and the B-series word line WLb (PO) to be formed at both ends in the X direction. The storage node Nt2 (PO), the inverted storage node Nb2 (PO), the reset line RTL (PO) and the inverted reset line RBL (PO) are formed as necessary therebetween.

Such a configuration allows the access transistor Q3a having the A-series word line WLa (PO) as the gate, the MOS transistor for resetting MNr having the reset line RTL (PO) as the gate, and the access transistor Q4b having the B-series word line WLb (PO) as the gate to be formed in the n-type diffusion layer DFn1. The access transistor Q4a having the A-series word line WLa (PO) as the gate and the access transistor Q3b having the B-series word line WLb (PO) as the gate are formed in the n-type diffusion layer DFn2. In addition, the nMOS transistor partially configuring the inverter IV4 and having the inverted storage node Nb2 (PO) as the gate, and the nMOS transistor partially configuring the inverter IV3 and having the storage node Nt2 (PO) as the gate are formed in the n-type diffusion layer DFn2.

The pMOS transistor partially configuring the inverter IV4 and having the inverted storage node Nb2 (PO) as the gate, and the pMOS transistor partially configuring the inverter IV3 and having the storage node Nt2 (PO) as the gate are formed in the p-type diffusion layer DFp1. The pMOS transistor partially configuring the inverter IV5 and having the inverted storage node Nb2 (PO) as the gate, and the MOS transistor for resetting MPr having the inverted reset line RBL (PO) as the gate are formed in the p-type diffusion layer DFp2.

Figure 15:
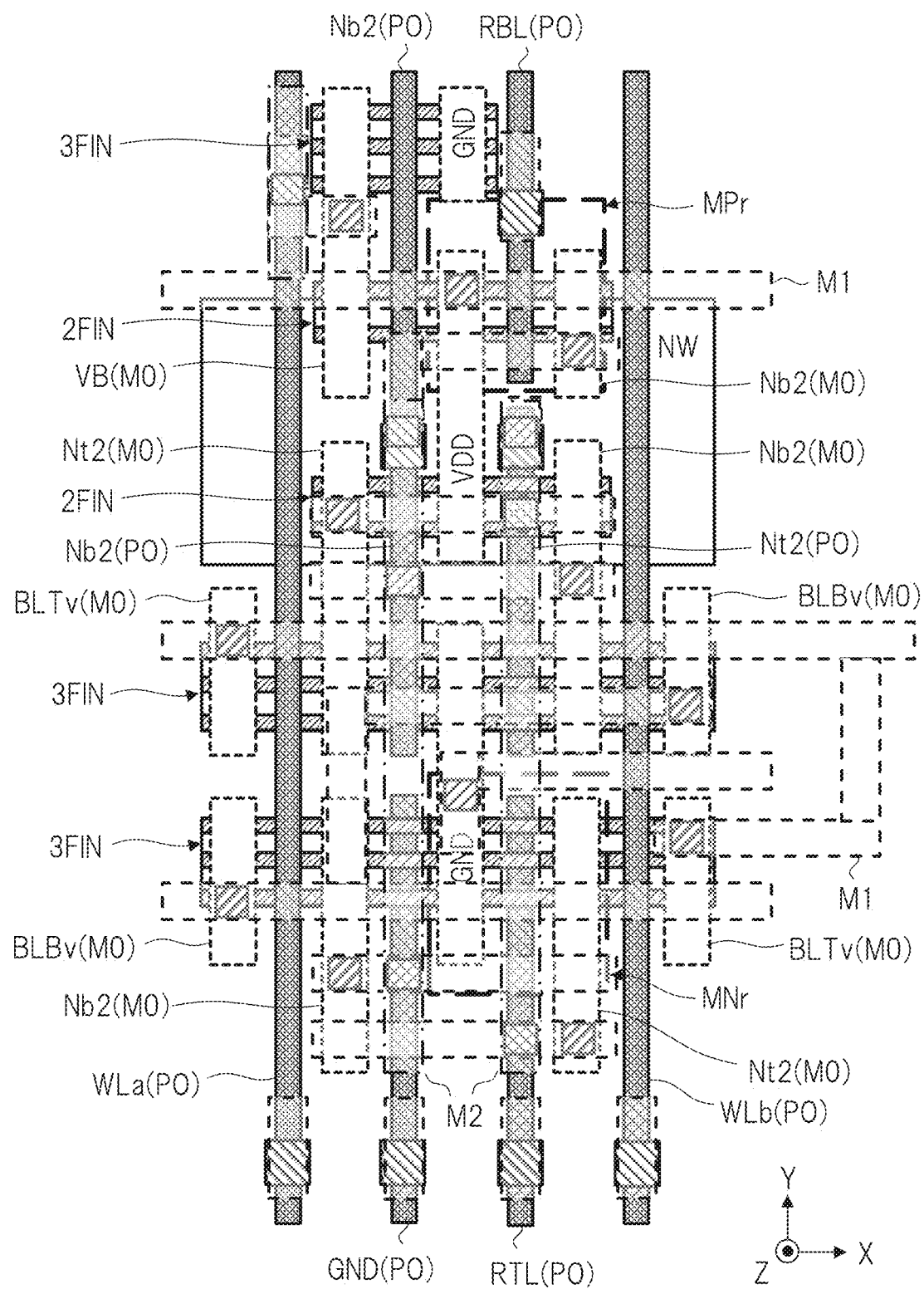
FIG. 15 is a plan view showing a layout configuration example modified from FIG. 14.

FIG. 15 is a plan view showing a layout configuration example modified from FIG. 14. In FIG. 15, arrangement of each of the circuits is the same as in the case shown in FIG. 14. FIG. 15 also shows a configuration of each of metal wiring layers (M0, M1, M2) as necessary. Unlike in the case shown in FIG. 14, FIG. 15 uses a FinFET (Fin Field Effect Transistor) structure instead of the transistor with a diffusion layer structure. For example, the MOS transistor for resetting MNr is formed by a 3-FIN structure, and the MOS transistor for resetting MPr is formed by a 2-FIN structure.

Using the valid bit cell as described above allows reset characteristics to be enhanced (quicker reset operation) while an increase in the circuit area is suppressed. Specifically, for example, in FIGS. 14 and 15, the reset characteristics can be enhanced by increasing the size (gate width (W)) of the MOS transistor for resetting (nMOS transistor) MNr (by using, for example, a 6-FIN structure, two transistors, or the like).

However, studies by the present inventors have found that, for example, rather than providing the MOS transistor for resetting MNr with a gate width of "2×W", providing the MOS transistor for resetting MNr with a gate width of "W" and the MOS transistor for resetting MPr with a gate width of "W" allows the reset characteristics to be enhanced. Further, as shown in FIGS. 14 and 15, the MOS transistor for resetting MPr can be efficiently laid out using a formation area of the pMOS transistor in which the area is relatively easy to secure. Therefore, it is beneficial to provide the MOS transistor for resetting MNr.

In the foregoing, the invention made by the present inventors has been concretely described based on the embodiments. However, the present invention is not to be limited to the foregoing embodiments, and various modifications can be made within the scope of the present invention.

What is claimed is:

1. A semiconductor device having a CAM (Content Addressable Memory) unit,
   wherein the CAM unit comprises:
      a plurality of CAM entries;
      a plurality of search lines provided so as to be common to the plurality of CAM entries and to which search data from outside the semiconductor device are input; and
      a common match output line provided so as to be common to the plurality of CAM entries,
   each of the plurality of CAM entries has:
      a plurality of CAM cells configured to discriminate a match or mismatch between stored data stored in advance and the search data;
      a match line coupled to the plurality of CAM cells, and having a voltage level controlled based on discrimination results of the plurality of CAM cells; and
      a first transistor and a second transistor coupled in series between the common match output line and a predetermined power source,
   the first transistor is controlled to be turned ON or OFF based on the voltage level of the match line,
   the second transistor is controlled to be turned ON or OFF by a search enabling signal asserted at a time of a search operation, and
   each of the plurality of CAM entries further has a third transistor coupled in parallel to the second transistor, and being controlled to be turned ON or OFF at a time of a read operation and based on a voltage level of a word line coupled to its own CAM entry.

2. The semiconductor device according to claim 1, further having:
   a precharge circuit configured to precharge the common match output line; and
   a sense amplifier configured to amplify a voltage level of the common match output line,
   wherein the precharge circuit and the sense amplifier are configured to operate at the time of the search operation and at the time of the read operation.

3. The semiconductor device according to claim 1, further having:
   an inverted common match output line as a differential counterpart of the common match output line;
   a fourth transistor, a fifth transistor and a sixth transistor provided for the inverted common match output line so as to respectively correspond to the first transistor, the second transistor and the third transistor;
   a differential precharge circuit configured to precharge the common match output line and the inverted common match output line; and
   a differential type sense amplifier configured to amplify a differential voltage between a voltage level of the common match output line and a voltage level of the inverted common match output line,
   wherein the fifth transistor has one end coupled to the inverted common match output line and the other end open, and
   the differential type sense amplifier is activated at the time of the read operation.

4. The semiconductor device according to claim 2,
wherein the differential type sense amplifier is activated at the time of the read operation and at the time of the search operation, and
at the time of the search operation, the differential precharge circuit precharges the inverted common match output line to an intermediate voltage level between a voltage level of a high potential-side power source and a voltage level of a low potential-side power source.

5. The semiconductor device according to claim 1, further having:
a first CAM unit which is one of the CAM units and to which some bit regions of the search data are input; and
a second CAM unit which is another of the CAM units and to which other bit regions of the search data are input,
wherein the second CAM unit is controlled to be activated or deactivated at the time of the search operation in response to a voltage level of the common match output line of the first CAM unit.

6. The semiconductor device according to claim 1,
wherein each of the plurality of CAM entries further has a valid bit cell configured to store valid data representing validity or invalidity of its own CAM entry, the valid bit cell being accessible by a word line coupled to its own CAM entry, and
the valid bit cell has:
a latch circuit including a storage node and an inverted storage node;
a first MOS transistor for resetting coupled between the storage node and a low potential-side power source, and being controlled to be turned ON or OFF by a reset signal; and
a second MOS transistor for resetting coupled between the inverted storage node and a high potential-side power source, and being controlled to be turned ON or OFF by an inverted reset signal.

7. A semiconductor device having a TCAM (Ternary Content Addressable Memory) unit,
wherein the TCAM unit comprises:
a plurality of TCAM entries;
a plurality of search lines provided so as to be common to the plurality of TCAM entries and to which search data from outside the semiconductor device are input; and
a common match output line provided so as to be common to the plurality of TCAM entries,
each of the plurality of TCAM entries has:
a dual-port type valid bit cell configured to store valid data representing validity or invalidity of its own TCAM entry, the dual-port type valid bit cell being accessible by a first word line or a second word line;
a plurality of TCAM cells configured to discriminate a match or mismatch between stored data stored in advance and the search data;
a match line coupled to the plurality of TCAM cells, and having a voltage level controlled based on discrimination results of the plurality of TCAM cells;
a first transistor and a second transistor coupled in series between the common match output line and a predetermined power source; and
a third transistor coupled in parallel to the second transistor,
the first transistor is controlled to be turned ON or OFF based on the voltage level of the match line,
the second transistor is controlled to be turned ON or OFF by a search enabling signal asserted at a time of a search operation, and
at a time of a read operation, the third transistor is controlled to be turned ON or OFF by the first word line or the second word line.

8. The semiconductor device according to claim 7,
wherein the third transistor is constituted by a third-A transistor and a third-B transistor coupled in parallel,
the third-A transistor is controlled to be turned ON or OFF by the first word line, and
the third-B transistor is controlled to be turned ON or OFF by the second word line.

9. The semiconductor device according to claim 8, further having:
an inverted common match output line as a differential counterpart of the common match output line;
a fourth transistor, a fifth transistor, a sixth-A transistor and a sixth-B transistor provided for the inverted common match output line so as to respectively correspond to the first transistor, the second transistor, the third-A transistor and the third-B transistor;
a differential precharge circuit configured to precharge the common match output line and the inverted common match output line; and
a differential type sense amplifier configured to amplify a differential voltage between a voltage level of the common match output line and a voltage level of the inverted common match output line,
wherein the fifth transistor has one end coupled to the inverted common match output line and the other end open, and
the differential type sense amplifier is activated at the time of the read operation.

10. The semiconductor device according to claim 9,
wherein the differential type sense amplifier is activated at the time of the read operation and at the time of the search operation, and
at the time of the search operation, the differential precharge circuit precharges the inverted common match output line to an intermediate voltage level between a voltage level of a high potential-side power source and a voltage level of a low potential-side power source.

11. The semiconductor device according to claim 7, further having:
a first CAM unit which is one of the CAM units and to which some bit regions of the search data are input; and
a second CAM unit which is another of the CAM units and to which other bit regions of the search data are input,
wherein the second CAM unit is controlled to be activated or deactivated at the time of the search operation in response to a voltage level of the common match output line of the first CAM unit.

12. The semiconductor device according to claim 7,
wherein the valid bit cell has:
a latch circuit including a storage node and an inverted storage node;
a first MOS transistor for resetting coupled between the storage node and a low potential-side power source, and being controlled to be turned ON or OFF by a reset signal; and
a second MOS transistor for resetting coupled between the inverted storage node and a high potential-side power source, and being controlled to be turned ON or OFF by an inverted reset signal.

\* \* \* \* \*